(12) United States Patent
Yamada et al.

(10) Patent No.: US 10,021,781 B2
(45) Date of Patent: Jul. 10, 2018

(54) THIN CIRCUIT BOARD HAVING WALL FOR SOLDER MATERIAL

(71) Applicant: NHK SPRING CO., LTD., Yokohama-shi, Kanagawa (JP)

(72) Inventors: Yukie Yamada, Kanagawa (JP); Junya Jonishi, Kanagawa (JP); Subaru Tomizawa, Kanagawa (JP)

(73) Assignee: NHK Spring Co., Ltd., Kanagawa (JP)

( * ) Notice: Subject to any disclaimer, the term of this patent is extended or adjusted under 35 U.S.C. 154(b) by 0 days.

(21) Appl. No.: 15/401,242

(22) Filed: Jan. 9, 2017

(65) Prior Publication Data

US 2017/0202082 A1  Jul. 13, 2017

(30) Foreign Application Priority Data

Jan. 7, 2016 (JP) ................. 2016-002021

(51) Int. Cl.
*H05K 1/05* (2006.01)
*H05K 1/03* (2006.01)

(52) U.S. Cl.
CPC ............. *H05K 1/05* (2013.01); *H05K 1/0393* (2013.01); *H05K 2201/058* (2013.01)

(58) Field of Classification Search
CPC ............................. H05K 1/05; H05K 1/0393
USPC ........................................................ 174/254
See application file for complete search history.

(56) References Cited

U.S. PATENT DOCUMENTS 7,781,679 B1 * 8/2010 Schreiber ................. H05K 3/44
174/254
2015/0138675 A1   5/2015 Arai et al.

FOREIGN PATENT DOCUMENTS

| JP | 63283051 | * | 11/1988 |
| JP | 11295021 | * | 10/1999 |
| JP | 2003309217 | * | 10/2003 |
| JP | 2012150861 | * | 8/2012 |
| JP | 2015-097133 A | | 5/2015 |

* cited by examiner

*Primary Examiner* — Timothy Thompson
*Assistant Examiner* — Charles Pizzuto
(74) *Attorney, Agent, or Firm* — Norris McLaughlin & Marcus, P.A.

(57) ABSTRACT

A thin circuit board such as a flexure has a metal support layer forming a substrate, a base insulating layer provided on the metal support layer, a wiring layer being wiring traces provided on the base insulating layer, a cover insulating layer covering the wiring layer, internal terminals provided to the respective wiring traces and sequentially arranged side by side, each one internal terminal of said internal terminals used to be solder-bonded to a corresponding external terminal through solder material, and a wall provided for the solder material on at least any one of adjacent internal terminals of said internal terminals.

5 Claims, 20 Drawing Sheets

THIN CIRCUIT BOARD HAVING WALL FOR SOLDER MATERIAL

BACKGROUND OF THE INVENTION

1. Field of the Invention

The present invention relates to a thin circuit board used for, for example, a flexure of a head suspension.

2. Description of the Related Art

An information processing unit such as a personal computer frequently has a hard disk drive (HDD). The hard disk drive includes magnetic disks being rotatable around a spindle and a carriage being turnable around a pivot shaft, and the like. The carriage has arms in which a head suspension for a disk drive (hereinafter, referred to simply as "head suspension") is provided to each one arm.

As disclosed in JP 2015-97133 A, a head suspension generally has a load beam and a flexure laid on the load beam. The flexure has a gimbal portion formed in the vicinity of a front end of the flexure. To the gimbal, a magnetic head including a slider is attached. The magnetic head includes read/write elements and the like. These head suspension, flexure and the like form a head gimbal assembly.

As such a flexure, there are various kinds of practical applications according to required specifications. As an example of the practical applications, there is known as a flexure with conductors that is a thin circuit board (the "flexure with conductors" is referred to as a "flexure" in the following explanation). The flexure includes a metal support layer made of a thin stainless steel plate, a base insulating layer formed on the metal support layer and made of electric insulating material such as polyimide, a wiring layer routed as a plurality of wiring traces on the surface of the base insulating layer, and the like. The flexure has a body portion being laid on the load beam and a tail portion extending rearward from a base plate.

In a basic structure of the wiring traces, some wing traces are for writing information and some other wiring traces are for reading information. One ends of these wiring traces are connected to elements, for example, MR (magneto Resistive) elements provided on the magnetic head. Other ends of these wiring traces are connected to internal terminals formed on a tail pad portion of the flexure. The internal terminals are electrically connected to respective external terminals of a circuit board such as FPC (Flexible Printed Circuit board). On the circuit board, a signal processing circuit such as a preamplifier is mounted.

In JP 2015-97133 A, the internal terminals are laid on the respective external terminals of the circuit board and are connected thereto by a bonding means such as ultrasonic bonding.

On the other hand, there is a technique using solder bonding instead of the ultrasonic bonding or the like in view of reliability of connection. In this case, the internal terminals are laid on the external terminal of the circuit board through micro solder balls and the both terminals are connected by reflow bonding.

The structure, however, involves a problem of a solder bridge to cause a short circuit.

In particular, the number of the internal terminals to be connected to the external terminals of the circuit board increases as the number of the wiring traces increases in accordance with the multi-functionalized head suspension.

Additionally, the hard disk drive becomes increasingly miniaturized to limit an area of the internal terminals occupying the tail pad portion. This naturally reduces a distance between the adjacent internal terminals, this reduction of the distance frequently causes a solder bridge and a countermeasure for that problem is demanded.

In this case, a solder bridge may be prevented by reducing a diameter of a micro solder ball. This, however, causes a problem that a solder fillet does not have an enough size for connection.

SUMMARY OF THE INVENTION

An object of the present invention is to provide a thin circuit board, capable of obtaining a solder fillet having an enough size for connection while suppressing generation of a solder bridge in a case where a distance between adjacent internal terminals is reduced.

In order to accomplish the object, a first aspect of the present invention provides a thin circuit board including a metal support layer forming a substrate, a base insulating layer provided on a surface of the metal support layer, a wiring layer being wiring traces provided on a surface of the base insulating layer, a cover insulating layer covering the wiring traces, internal terminals provided to the respective wiring traces and sequentially arranged side by side, each one internal terminal of said internal terminals used to be solder-bonded to a corresponding external terminal through solder material, and a wall provided for the solder material on at least any one of adjacent internal terminals of said internal terminals.

According to the first aspect, the wall suppresses a flow of reflowed or melted solder material at the time of solder bonding, thereby to prevent a solder bridge from being formed and a short circuit from being made between the adjacent internal terminals even if a diameter of a micro solder ball is not reduced according to an interval of the adjacent internal terminals. This obtains a solder fillet having an enough size for connection.

If the wall includes walls to define a recessed portion on said any one of adjacent internal terminals, the recessed portion traps the solder material and allows a fillet to be formed with an enough size for connection.

DETAILED DESCRIPTION OF EMBODIMENTS

Embodiments according to the present invention will be explained. Each embodiment provides a thin circuit board capable of obtaining a solder fillet having an enough size for connection while suppressing generation of a solder bridge in a case where a distance between adjacent internal terminals is reduced.

For this, the thin circuit board has a wall provided for solder material on at least any one of adjacent internal terminals of internal terminals that are sequentially arranged side by side.

The wall may circumferentially surround a central portion of said at least any one of the adjacent internal terminals to define a recessed portion for trapping the solder material.

The wall may be defined based on a hole and/or a thin part formed in the base insulating layer and/or the wiring layer.

The wall may be formed to a ground part extending from the wiring layer through the base insulating layer to the metal support layer for ground.

Hereinafter, the embodiments of the present invention will be explained in detail with reference to drawings.

FIGS. 1 to 5 relate to the first reference example for easily understanding the embodiments of the present invention and FIGS. 6 to 10 relate to the second reference example for the same. A hard disk drive and a head suspension to which a flexure is attached will be explained using the first and second reference examples as a basis for understanding a structure and a function of a flexure serving as a thin circuit board according to the embodiment.

Figure 1:
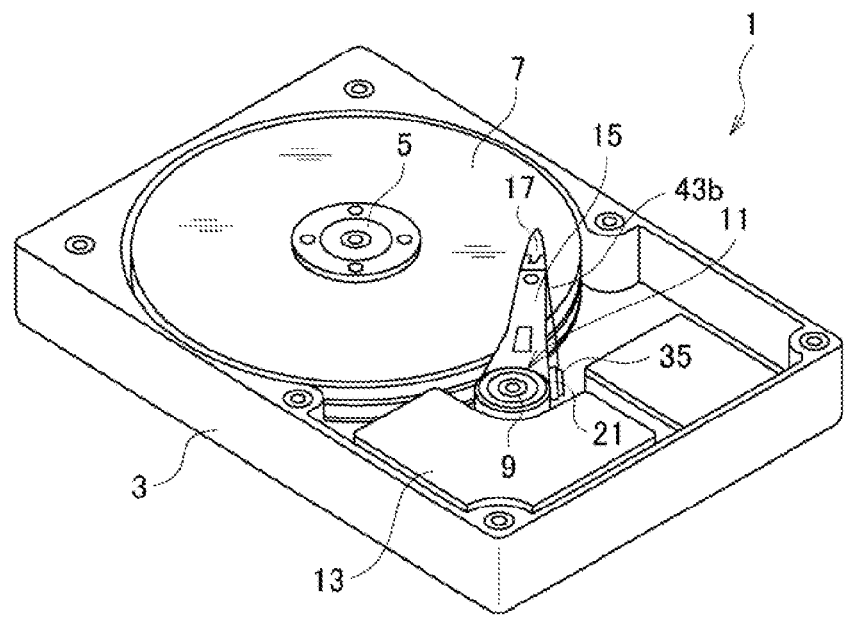
FIG. 1 is a perspective view schematically illustrating a hard disk drive having a head suspension according to a first reference example of the present invention.

FIG. 1 is a perspective view schematically illustrating the hard disk drive. The hard disk drive 1 of FIG. 1 has a case 3, a spindle 5, a disk 7 rotatable around the spindle 5, a pivot shaft 9, a carriage 11 turnable around the pivot shaft 9, a positioning motor 13 for driving the carriage 11, and the like. The case 3 is tightly close with a lid (not illustrated).

Figure 2:
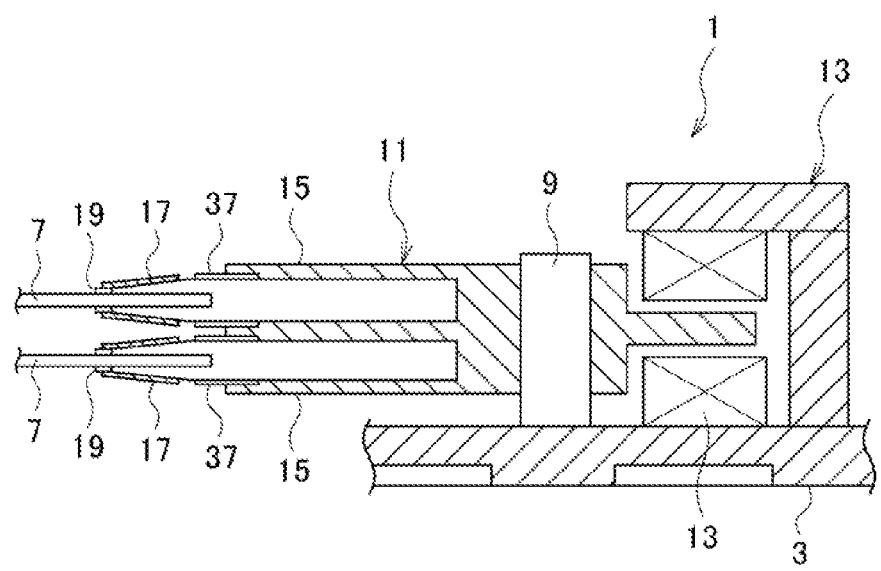
FIG. 2 is a sectional view schematically illustrating a part of the hard disk drive of FIG. 1.

FIG. 2 is a sectional view schematically illustrating a part of the hard disk drive of FIG. 1. As illustrated in FIG. 2, the carriage 11 has arms 15. At a front end of each arm 15, a head suspension 17 is attached. At a front end of the head suspension 17, a slider 19 serving as a magnetic head is provided. When the disk 7 rotates at high speed, an air bearing is formed between the disk 7 and the slider 19 to read and write information.

Then, the carriage 11 is turned by the positioning motor 13 to move the head suspension 17 in a radial direction of the disk 7, thereby to transporting the slider 19 to a target track of the disk 7. The slider 19 has a magnetic coil to write or record data to the disk 7, an MR element to read the recorded data from the disk 7, a heater and the like. The MR element serves as a reading means to convert a magnetic signal into an electric signal and vice versa.

Figure 3:
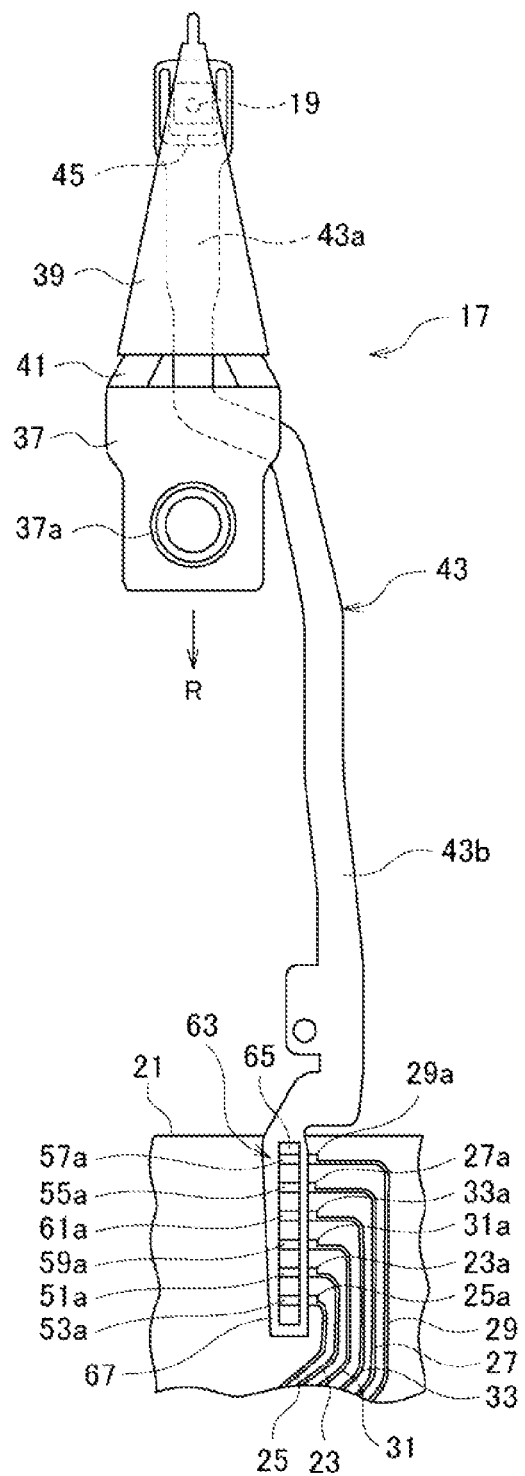
FIG. 3 is a plan view schematically illustrating the head suspension with a flexure attached thereto and connected to a circuit board according to the first reference example.

FIG. 3 is a plan view schematically illustrating the head suspension with the flexure attached thereto and connected to a circuit board.

As illustrated in FIG. 3, an example of the circuit board 21 is an FPC. The circuit board 21 has write wiring traces 23 and 25, read wiring traces 27 and 29, a heater wiring trace 31, and a ground wiring trace 33. The wiring traces 23, 25, 27, 29, 31 and 33 include external terminals 23a, 25a, 27a, 29a, 31a and 33a that are exposed on the surface of the circuit board 21.

On the circuit board 21, a preamplifier 35 (FIG. 1) is mounted to serve as part of a signal processing circuit. The preamplifier 35 is connected to the write wiring traces 23 and 25 and the read wiring traces 27 and 29. Writing current output from the preamplifier 35 is fed to the magnetic coil of the slider 19 through the write wiring traces 23 and 25. An electric signal output from the MR element of the slider 19 is input to the preamplifier 35 through the read wiring traces 27 and 29. A current in the write wiring traces 23 and 25 is larger than in the read wiring traces 27 and 29.

The head suspension 17 has a base plate 37, a load beam 39, a hinge member 41, a flexure 43 and the like. The base plate 37 includes a boss 37a that is fixed to the arm 15 (FIGS. 1 and 2) of the carriage 11. The flexure 43 includes a tongue 45 (FIG. 3) in the vicinity of a front end thereof. To the tongue 45, the slider 19 is attached.

The flexure 43 includes a body portion 43a arranged along the load beam 39 and a tail portion 43b extending rearward from the body portion 43a relative to the base plate 37. Extending rearward relative to the base plate 37 is of a direction represented with an arrow R in FIG. 3, i.e., a direction approaching the circuit board 21. The body portion 43a of the flexure 43 is fixed to the load beam 39 by a fixing means such as laser welding.

Figure 4:
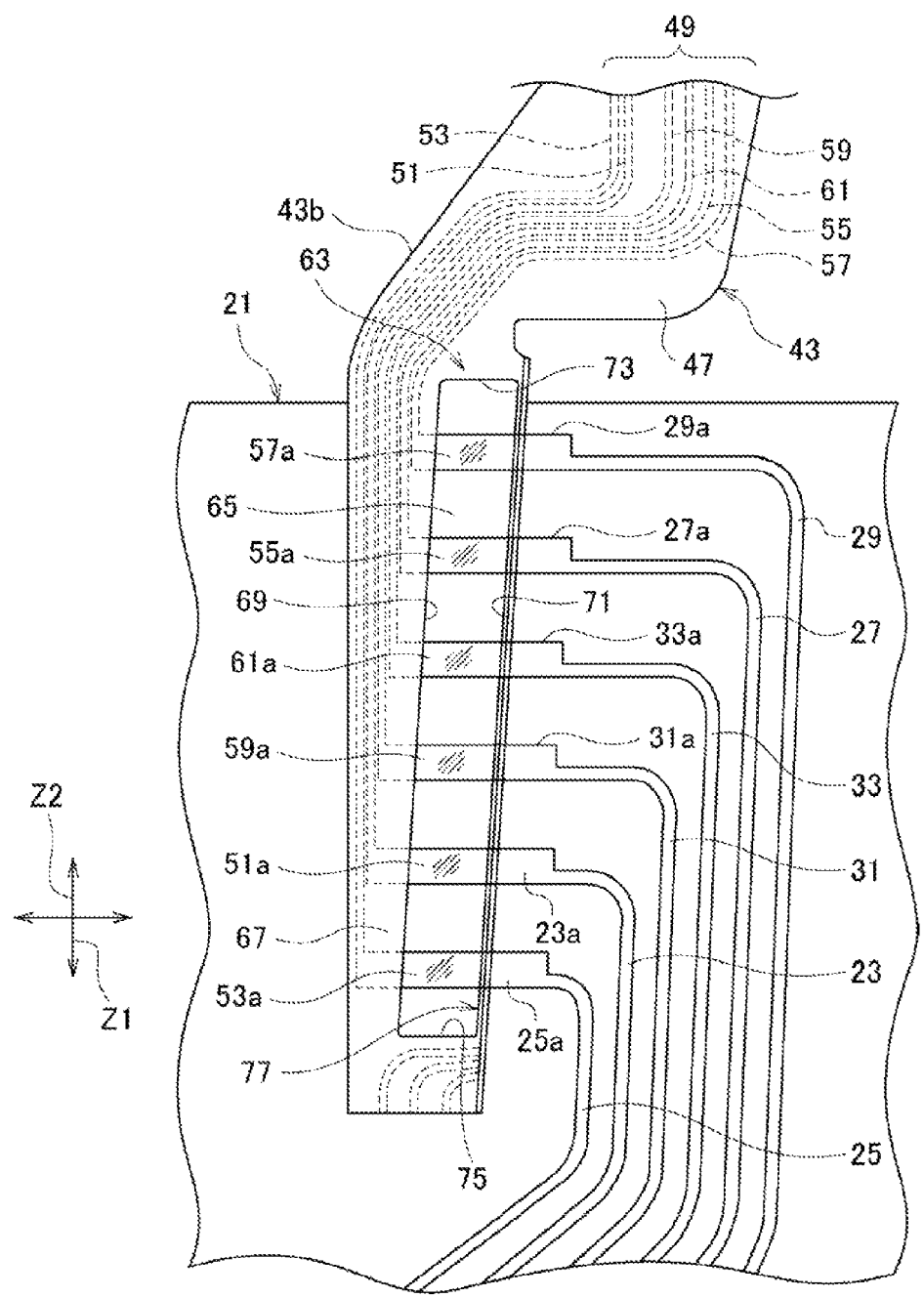
FIG. 4 is a plan view partly illustrating a tail pad portion of the flexure and the circuit board connected to the tail pad portion.
Figure 5:
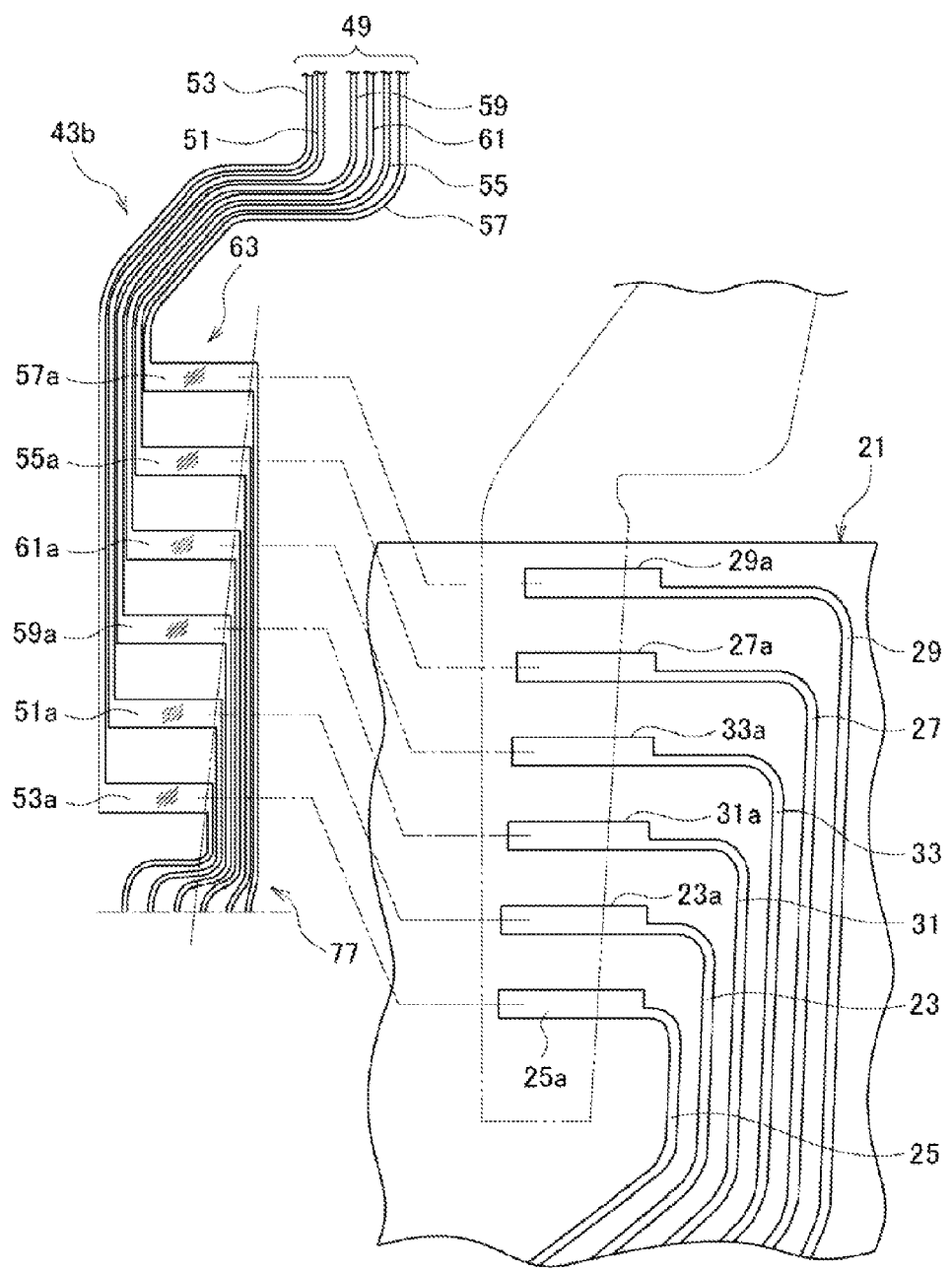
FIG. 5 is a plan view partly illustrating the tail pad portion of the flexure and the circuit board separated from each other.

FIG. 4 is a plan view partly illustrating a tail pad portion 63 of the flexure 43 and the circuit board 21 connected to the tail pad portion 63. FIG. 5 is a plan view partly separately illustrating the tail pad portion 63 and the circuit board 21 separated from each other.

The flexure 43 has a metal support layer 47 and a wiring part 49. The metal support layer 47 serves as a metal base made of a metal plate such as an austenite stainless steel plate. The metal support layer 47 is workable by deformation processing such as bending and has resilience. The metal support layer 47 has a thickness smaller than a thickness of the load beam 39. The thickness of the load beam 39 is about 30-62 μm and the thickness of the metal support layer 47 is about 18 μm (12-25 μm).

The wiring part 49 is formed along the metal support layer 45 and includes a base insulating layer formed on the metal support layer 47, wiring traces 51, 53, 55, 57, 59 and 61 arranged on the surface of the base insulating layer, and a cover insulating layer covering the wiring traces 51, 53, 55, 57, 59 and 61. The wiring traces 51 and 53 are write wiring traces, the wiring traces 55 and 57 are read wiring traces, the wiring trace 59 is a heat wiring trace, and the wiring trace 61 is a ground wiring trace.

The tail portion 43b has a tail pad portion 63. In the tail pad portion 63, write terminals 51a and 53a, read terminals 55a and 57a, a heater terminal 59a, a ground terminal 61a are arranged as internal terminals.

The internal terminals 51a, 53a, 55a, 57a, 59a and 61a are arranged side by side in parallel with each other in the tail pad portion 63. The internal terminals 51a, 53a, 55a, 57a, 59a and 61a are laid on the respective external terminals 23a, 25a, 27a, 29a, 31a and 33a of the circuit board 21 and are connected thereto by a bonding means such as ultrasonic bonding.

The metal support layer 47 in the tail pad portion 63 has a frame 67 defining an opening 65. The opening 65 is elongated in a longitudinal direction (represented with an arrow Z1 in FIG. 4) of the tail portion 43a. The opening 65 of the metal support layer 47 is formed by etching. The opening 65 is also formed in the base insulating layer and the cover insulating layer. The internal terminals 51a, 53a, 55a, 57a, 59a and 61a cross or bridge the opening 65 and are exposed outside within the opening 65, respectively.

The opening 65 includes vertical frames 69 and 71 and lateral frames 73 and 75. The vertical frames 69 and 71 extend in the longitudinal direction of the tail portion 43b (represented with the arrow Z1 in FIG. 4) and the lateral frames 73 and 75 extend in a lateral direction of the tail portion 43b (represented with an arrow Z2 in FIG. 4). The vertical frames 69 and 71 and the lateral frames 73 and 75, therefore, compose the frame 67 and are part of the metal support layer 47.

As the first reference example, a stub 77 remains after test pads are cut off as illustrated in FIG. 4.

Figure 6:
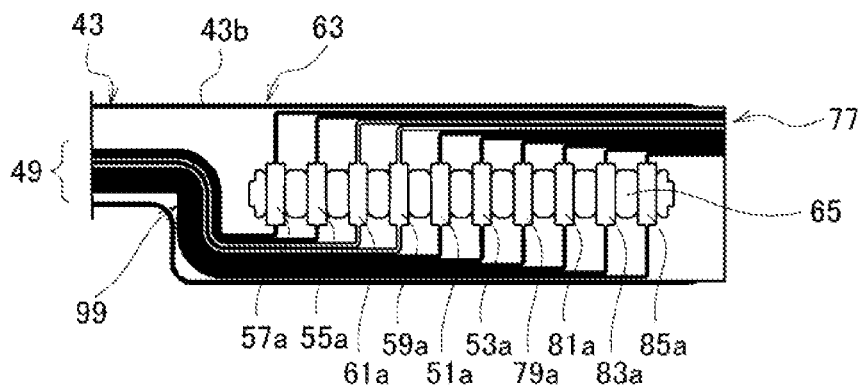
FIG. 6 is a plan view partly illustrating internal terminals of a flexure according to a second reference example of the present invention.
Figure 7:
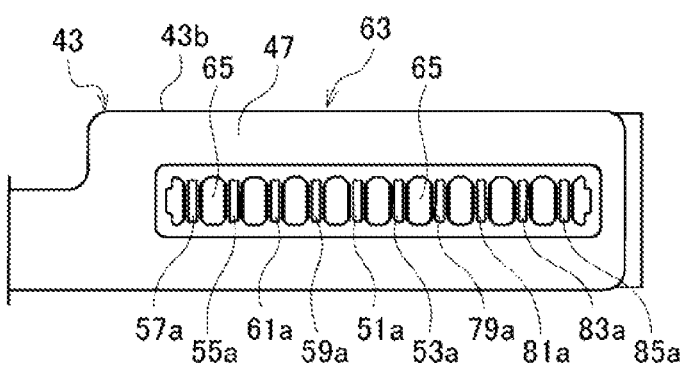
FIG. 7 is a bottom view partly illustrating the internal terminals of the flexure of FIG. 6.
Figure 8:
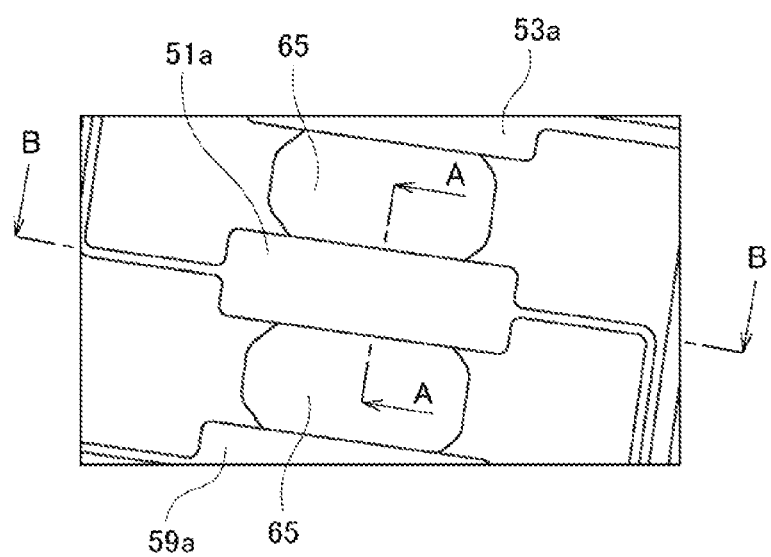
FIG. 8 is a plan view illustrating one of the internal terminals of FIG. 6.
Figure 9:
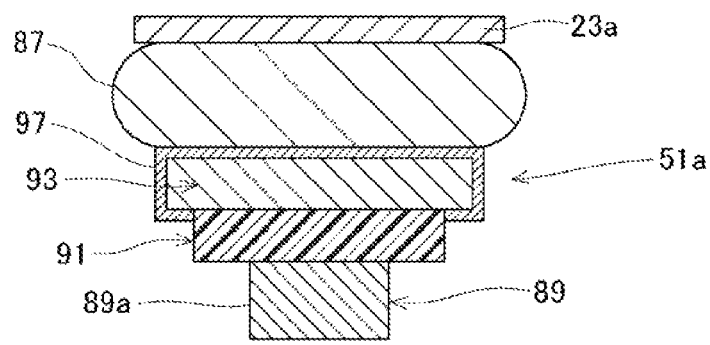
FIG. 9 is a sectional view taken along a line A-A of FIG. 8.
Figure 10:
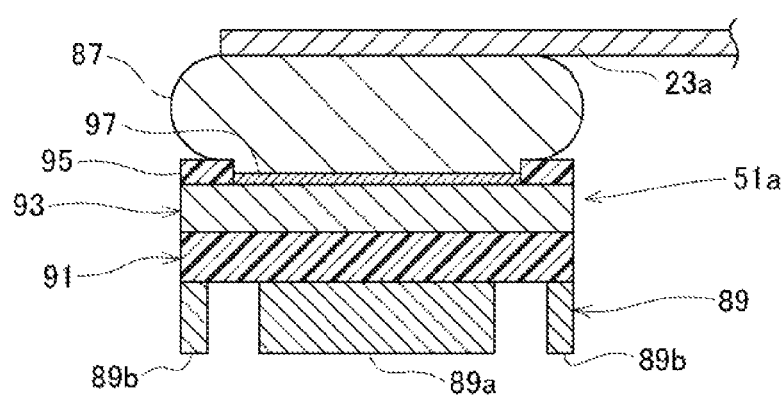
FIG. 10 is a sectional view taken along a line B-B of FIG. 8.

FIGS. 6-10 illustrate a tail pad portion of the second reference example has, with multi-functionalization of a head suspension 17, more internal terminals to be used for connection relative to a circuit board than the aforementioned tail pad portion. FIG. 6 is a plan view partly illustrating internal terminals of the flexure. FIG. 7 is a bottom view partly illustrating the internal terminals of the flexure of FIG. 6. FIG. 8 is a plan view illustrating one of the internal terminals of FIG. 6. FIG. 9 is a sectional view taken along a line A-A of FIG. 8. FIG. 10 is a sectional view taken along a line B-B of FIG. 8.

Corresponding parts or components of the second reference example are represented with the same reference numerals as those of the first reference example to eliminate duplicate explanation. The un-stated explanation for the second reference example is referred to for the first reference example.

As illustrated in FIGS. 6-7, the second reference example has internal terminals 51a, 53a, 55a, 57a, 59a, 61a, 79a, 81a, 83a and 85a including additional internal terminals relative to the internal terminals 51a, 53a, 55a, 57a, 59a and 61a of the first reference example of FIG. 3, thereby to adapt the multi-functionalization.

The internal terminals 51a, 53a, 55a, 57a, 59a, 61a, 79a, 81a, 83a and 85a of the second reference example are provided to a plurality of wiring traces, respectively. These internal terminals 51a . . . cross or bridge the opening 65 and are sequentially arranged side by side in parallel with each other in the tail pad portion 63. Though the sequential side-by-side arrangement is performed at regular intervals, the internal terminals may be sequentially arranged at partly different intervals. The shape of the opening 65 is different from that of the first reference example of FIG. 4 at both longitudinal ends in the longitudinal direction of the tail portion 43b. The opening 65 of the second reference example has the same function as that of the first reference example.

The interval between the adjacent internal terminals in the internal terminals 51a . . . of the second reference example in the longitudinal direction of the tail pad portion 63 is smaller than of the first reference example according to increase in the number of the internal terminals.

The internal terminals 51a . . . form an end of the wiring part 49, a layer structure of which corresponds to that of the wiring part 49 of the first reference example.

The layer structure will be explained only for the internal terminal 51a with reference to FIGS. 8-10. The other internal terminals have substantially the same layer structure as the internal terminal 51a. The internal terminal 85a, however, is provided with an additional structure for ground.

The internal terminal 51a has a terminal metal support layer 89, a terminal base insulating layer 91 provided on the surface of the terminal metal support layer 89, a terminal layer 93 formed on the surface of the terminal base insulating layer 91, a terminal cover insulating layer 95, and a gold plate 97 covering the terminal layer 93. A nickel plate may be applied as a foundation for the gold plate 97.

The terminal metal support layer 89 is a metal support layer forming a substrate. The terminal metal support layer 89 is part of the metal support layer 47 of the first reference example (FIGS. 4 and 5), material and a thickness of which are the same as those of the metal support layer 47 of the first reference example. The terminal metal support layer 89 in the internal terminal 51a is provided with an island portion 89a at a center thereof.

Referring to FIGS. 9 and 10 as the A-A cross-section and the B-B cross-section, a terminal surface is flat in the A-A cross-section and a central portion of the terminal surface is slightly recessed relative to portions of the terminal cover insulating layer 95 at both sides of the central portion in the B-B cross-section. The recessed shape is based on the thicknesses of the terminal cover insulating layer 95 and the gold plate 97.

In the B-B cross-section, a width of the island portion 89a is larger than that in the A-A cross-section and side walls 89b are arranged apart from the island portion 89a at both sides. The island portion 89a and the side walls 89b are formed for reinforcement and are part of the metal support layer 47. The side walls 89b are integrated with the main body of the support layer 47 (FIG. 4).

The terminal base insulating layer 91 and the terminal cover insulating layer 95 are the same as the base insulating layer and the cover insulating layer of the wiring part 49 of the first reference example (FIG. 4), respectively. The terminal base insulating layer 91 and the terminal cover insulating layer 95 are made of electric insulating material such as polyimide. A thickness of the terminal base insulating layer 91 is set to, for example, 10 µm (about 5-20 µm). A thickness of the terminal cover insulating layer 95 is set to, for example, 5 µm (about 2-10 µm).

The terminal layer 93 is integrated with the wiring trace 51 to form an end of the wiring trace 51 (FIGS. 4 and 5). The wiring trace 51 composes the wiring layer 99 (FIG. 6) together with the other wiring traces. The terminal layer 93 is made of a copper plate and has a thickness of, for example, 10 µm (about 4-15 µm). The terminal layer 93 is covered with the terminal cover insulating layer 95 at both sides of the terminal surface in the B-B cross-section. The gold plate 97 is formed as a surface thin layer and has a thickness of, 0.5 µm (about 0.1-5.0 µm).

In the second reference example, the internal terminals 51a . . . and the external terminals 23a . . . are laid one on another and are joined together, respectively. The external terminals 23a . . . of the second reference example includes additional external terminals relative to the first reference example so that the number of the external terminals 23a . . . corresponds to that of the internal terminals 51a . . . .

The joining of connection is conducted by reflow bonding using micro solder balls instead of the ultrasonic bonding of the first reference example. Namely, the micro solder balls are reflowed to form solder fillets 87 through which the internal and external terminals are solder-bonded to each other. This improves reliability of the connection.

In the A-A cross-section, however, the terminal surface is flat and the intervals on both sides of the internal terminal 51a relative to the adjacent internal terminals are narrower than of the first reference example.

Accordingly, there is a risk that melted solder material flows out from the terminal surface so as to form a bridge in the interval between the adjacent internal terminals when reflowing a conventional micro solder ball having the same size as the first reference example to form a solder fillet while keeping a predetermined distance between the internal and external terminals.

Figure 11:
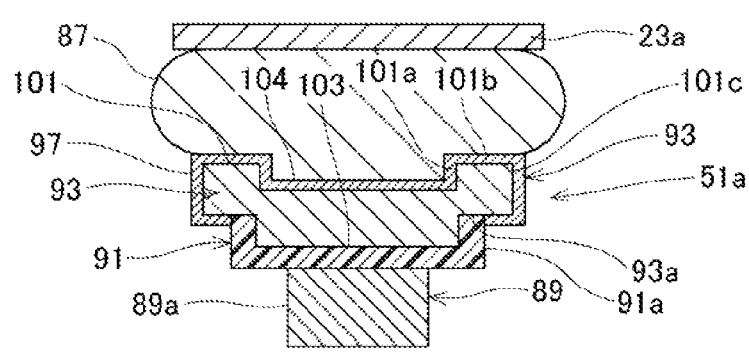
FIG. 11 is a sectional view on a plane corresponding to the plane taken along the line A-A of FIG. 8 according to a first embodiment of the present invention.
Figure 12:
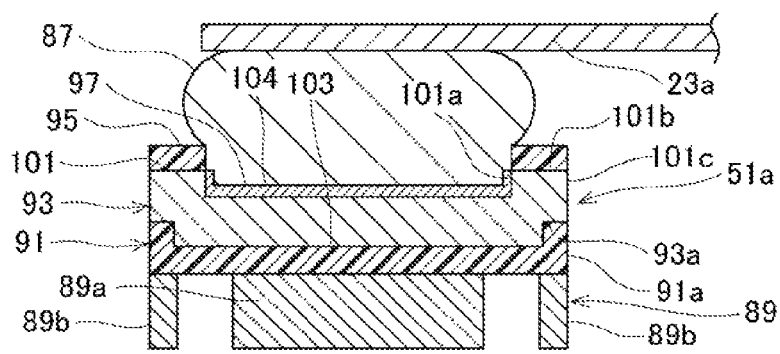
FIG. 12 is a sectional view on a plane corresponding to the plane taken along the line B-B of FIG. 8 according to the first embodiment.

FIGS. 11 and 12 relate to the first embodiment. FIG. 11 is a sectional view on a plane corresponding to the plane taken along the line A-A of FIG. 8. FIG. 12 is a sectional view on a plane corresponding to the plane taken along the line B-B of FIG. 8. In the first embodiment, the basic structure is referred to that of the first or second reference example and corresponding parts or components are represented with the same reference numerals as those of the first or second reference example.

With reference to FIGS. 11 and 12, the internal terminal 51a will be mainly explained. The other internal terminals 53a, 55a, 57a, 59a, 61a, 79a, 81a, 83a and 85a have the same structure as the internal terminal 51a. The internal terminal 85a as a ground terminal, however, is provided with an additional structure for ground.

The first embodiment is an application to a flexure manufactured by, for example, a semi-additive method.

The internal terminal 51a has a wall 101. The wall 101 is an obstacle against reflowed or melted solder material and is to, for example, stop a flow of the melted solder material. The wall 101 is formed on each one of the other internal terminals 53a, 55a, 57a, 59a, 61a, 79a, 81a, 83a and 85a in the same way. With this, the wall is provided for the solder material on each one of adjacent internal terminals in the internal terminals 53a, 55a, 57a, 59a, 61a, 79a, 81a, 83a and 85a. The wall, however, may be provided at least one of the adjacent internal terminals.

In order to form the wall 101, the first embodiment provides the terminal base insulating layer 91 with a thin portion 103 that is a central portion of the terminal base insulating layer 91 thinned relative to the other portion thereof in the internal terminal 51a. The thin portion 103 has a uniform thickness. The thin portion 103, however, may be partly thicken or further thinned.

Following the terminal base insulating layer 91 including the thin portion 103, the terminal layer 93 is formed. The wall 101 is relatively defined by the central portion of the terminal surface that is recessed and circumferentially surrounds the central portion of the terminal layer 93, to define a recessed portion 104 for trapping the solder material.

The wall 101 forms a rectangular frame in a plan view in which a dimension in the A-A cross-section of FIG. 11 is shorter than in the B-B cross-section of FIG. 12.

The central portion of the terminal base insulating layer 9 is reinforced by the island portion 89a of the terminal metal support layer 89.

The wall 101 is provided with a circumferential inner surface 101a, an upper surface 101b, and a substantially circumferential outer surface 101c. The substantially circumferential outer surface 101c means that the outer surface 101c of the wall 101 is not completely circumferential so that the terminal metal support layer 89, the terminal base insulating layer 91, the terminal layer 93 and the terminal cover insulating layer 95 form part of the wiring part 49 on one side, for example, the left side in the B-B cross-section of FIG. 12 as illustrated in FIG. 4.

In the A-A cross-section of FIG. 11, the wall 101 has portions arranged to interpose the terminal surface at both sides in a direction (hereinafter, referred to as "side-by-side direction") along which the internal terminals 51a . . . are arranged side-by-side. The wall 101, however, may have a different shape as long as it suppresses a flow of the solder material at the time of reflowing the solder material. For example, the wall may have a portion formed on only one side of the internal terminal 51a in the A-A cross-section or have the portions formed on both sides in the A-A cross-section every other terminal.

Under the portions of the wall 101, the terminal base insulating layer 91 has outer edge portions 91a. Each outer edge portion 91a is located to contact a lower surface 93a of the terminal layer 93 and support the wall 101 from the bottom. The gold plate 97 spans from the terminal surface on the central portion of the terminal layer 93 through the inner surface 101a, upper surface 101b and outer surface 101c of the wall 101 to the lower surface 93a of the terminal layer 93.

In the B-B cross-section of FIG. 12, the wall 101 has portions arranged to interpose the terminal surface of the terminal 51a at both sides in a direction (hereinafter, referred to as "orthogonal direction") orthogonal to the side-by-side direction. Outer edge portions 91a of the terminal base insulating layer 91 are positioned under the portions of the wall 101 to contact the lower surface 93a of the terminal layer 93 and support the wall 101 from the bottom. The outer edge portions 91a of the terminal base insulating layer 91 are supported by the side walls 89b of the terminal metal support layer 89.

The method of manufacturing the flexure 43 will be explained around the internal terminal 51a.

The first step prepares a stainless steel substrate (SST substrate) to form the metal support layer 47.

The second step applies a polyimide precursor of photosensitive polyimide on the stainless steel substrate entirely. Then, exposure is conducted to the polyimide precursor so that the base insulating layer including the terminal base insulating layer 91 is formed on a part to be the metal support layer 47 and the terminal metal support layer 89 and the thin portion 103 is provided to the terminal base insulating layer 91 by thinning the central portion of the terminal base insulating layer 91. The thin portion 103 may be formed by etching or laser processing.

The third step prepares a patterned resist on the base insulating layer including the terminal base insulating layer 91 and forms the wiring layer 99 (FIG. 6) including the terminal layer 93 by copper plating. Then, the resist is separated from the base insulating layer.

The fourth step forms the cover insulating layer of the wiring part 49 including the terminal cover insulating layer 95 so as to cover the wiring layer 99.

In the case where the terminal base insulating layer 91 is formed narrower in the width direction than the terminal layer 93 as illustrated in FIG. 11, the terminal base insulating layer 91 has to be etched from the bottom or the side on which the SST substrate is attached in a next additional step.

Namely, the next additional step partially etches the SST substrate and thereafter etches the base insulating layer to shape the terminal base insulating layer 91 as illustrated in FIG. 11.

The fifth step performs gold plating to form the gold plate 97 on the terminal layer 93.

The sixth step etches the SST substrate to shape the terminal metal support layer 89 integrally with the metal support layer 47, thereby to obtain chained flexures. In this etching, the island portion 89a and the side walls 89b are shaped together with the other portions.

Thereafter, individual flexures 43 are cut off from the chain.

The method of soldering will be explained.

The internal terminals 51a . . . are laid on the respective external terminals 23a . . . of the circuit board (FIG. 4) in the same way as the joining or connection between the internal terminals 51a and 23a as illustrated in FIGS. 11 and 12. Then, the soldering method reflows the micro solder balls to form the fillets 87 of the solder material between the internal terminals 51a . . . and the external terminals 23a . . . and bond them together. This improves the reliability of the connection.

In particular, the wall 101 on each one of the internal terminals 51a . . . includes the portions arranged at both sides in the side-by-side direction (right-left direction of FIG. 11) as illustrated in the A-A cross-section of FIG. 11.

Further, the wall 101 on each one of the internal terminals 51a . . . includes the portions arranged at both sides in the orthogonal direction (right-left direction of FIG. 12) as illustrated in the B-B cross-section of FIG. 12.

Accordingly, the wall 101 defines the recessed portion 104 on the corresponding one of the internal terminals 51a . . . to trap the solder material.

The wall 101 suppresses the flow of the melted solder material and the recessed portion 104 traps the solder material, thereby to form the fillet 87.

Main effects of the embodiment will be explained.

The flexure 43 as the thin circuit board according to the embodiment of the present invention has the metal support layer 47 including the terminal metal support layer 89 and forming a substrate, the base insulating layer provided on the surface of the metal support layer 47 and including the terminal base insulating layer 91, the wiring layer 99 being the wiring traces provided on the surface of the base insulating layer and including the terminal layer 93, the cover insulating layer covering the wiring traces and including the terminal cover insulating layer 95, the internal terminals 51a, 53a, 55a, 57a, 59a, 61a, 79a, 81a, 83a and 85a provided to the respective wiring traces and sequentially arranged side by side, each one terminal of said internal terminals 51a . . . used to be solder-bonded to a corresponding external terminal in the external terminals 23a . . . through the solder material, and the wall 101 provided for the solder material on each one of said internal terminals 51a . . . .

Accordingly, the wall 101 fulfills the function to stop the flow of the melted solder material at the time of the reflow soldering, thereby to prevent a solder bridge from being generated. According to the embodiment, the recessed portion 104 is defined on each one of the internal terminals to trap the solder material and also fulfills the function to stop the flow of the melted solder material. This ensure the prevention of generation of a solder bridge.

Further, the wall 101 protrudes from the terminal surface of the corresponding one of the internal terminals 51a . . . so that the top end of the wall 101 in its protruding direction faces the opposite one of the external terminals 23a . . . with a gap. The gap between the top end of the wall 101 and the opposite one of the external terminals 23a . . . is narrower than between the terminal surface of the corresponding one of the internal terminals 51a . . . and the opposite one of the external terminals 23a . . . . This configuration effectively applies surface tension to the gap between the top end of the wall 101 and the opposite one of the external terminals 23a . . . while accommodating the solder material in the recessed portion 104.

Accordingly, the wall 101 prevents the melted or reflowed solder material from flowing out from the interspace between the wall 101 and the opposite one of the external terminals 23a . . . based on the effect of the obstruction and the surface tension due to the wall 101.

Further, the wall 101 allows the gap between the terminal surfaces of the internal terminal and the external terminal opposite to each other to be enlarged, thereby to ensure the recessed portion 104 to form the fillet 87 having the enough size for the connection.

The wall 101 is easy to be formed due to the exposure or the like to shape the terminal base insulating layer 91. The terminal base insulating layer 91 locally has the thin portion and the formation of the wall 101 does not affect strength or the like. The terminal layer 93 has the sufficient thickness similar to the related art.

Hereinafter, first to eleventh modifications according to the first embodiment will be explained.

Figure 13:
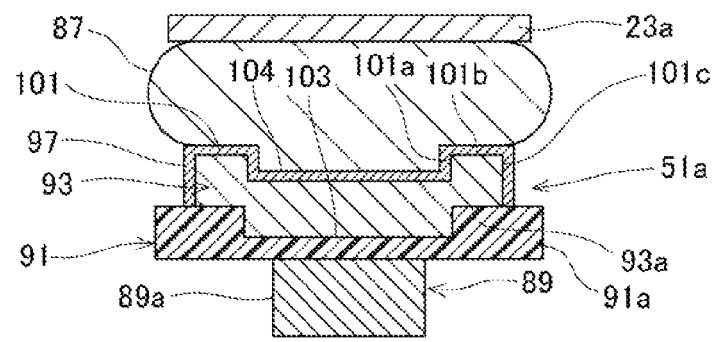
FIG. 13 is a sectional view on a plane corresponding to the plane taken along the line A-A of FIG. 8 according to a first modification of the first embodiment.
Figure 14:
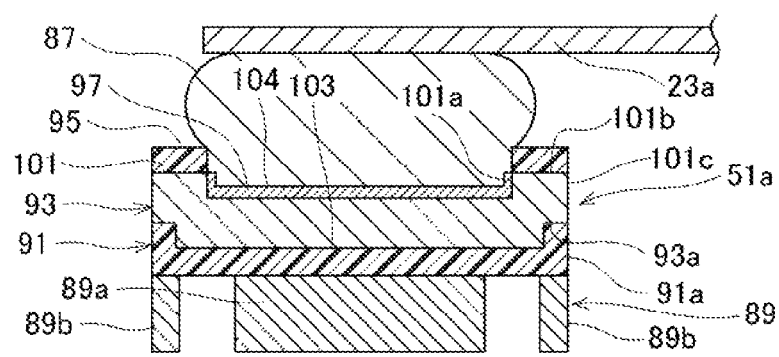
FIG. 14 is a sectional view on a plane corresponding to the plane taken along the line B-B of FIG. 8 according to the first modification of the first embodiment.

FIGS. 13 and 14 illustrate the first modification of the first embodiment. FIG. 13 is a sectional view on a plane corresponding to the plane taken along the line A-A of FIG. 8 and FIG. 14 is a sectional view on a plane corresponding to the plane taken along the line B-B of FIG. 8. In the first modification, the basic structure is referred to that of the first or second reference example or the first embodiment, and corresponding parts or components are represented with the same reference numerals as those of the first or second reference example or the first embodiment to eliminate duplicate explanation. Further, a difference between the first modification and the first embodiment will be mainly explained and explanation will be provided mainly for the internal terminal 51a of FIGS. 13 and 14 like the first embodiment.

The first modification is an application to the flexure manufactured by, for example, a semi-additive method.

The first embodiment of FIGS. 11 and 12 forms the terminal base insulating layer 91 to have the width in the side-by-side direction narrower than that of the terminal layer 93. In contrast, the first modification of FIGS. 13 and 14 elongates each outer edge portion 91a of the terminal base insulating layer 91 so that the base insulating layer 91 has the width in the side-by-side direction wider than that of the terminal layer 93.

The first modification of the first embodiment, therefore, fully supports the lower surface 93a of the terminal layer 93 with the outer edge portion 91a of the terminal base insulating layer 91.

Further, the first modification of the first embodiment provides the same effect as the first embodiment according to the wall 101 and the recessed portion 104.

Figure 15:
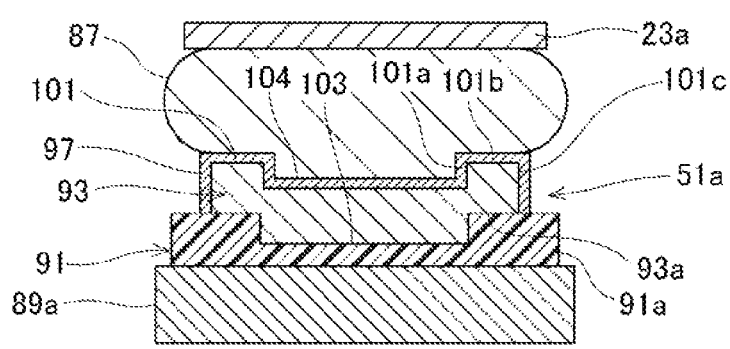
FIG. 15 is a sectional view on a plane corresponding to the plane taken along the line A-A of FIG. 8 according to a second modification of the first embodiment.
Figure 16:
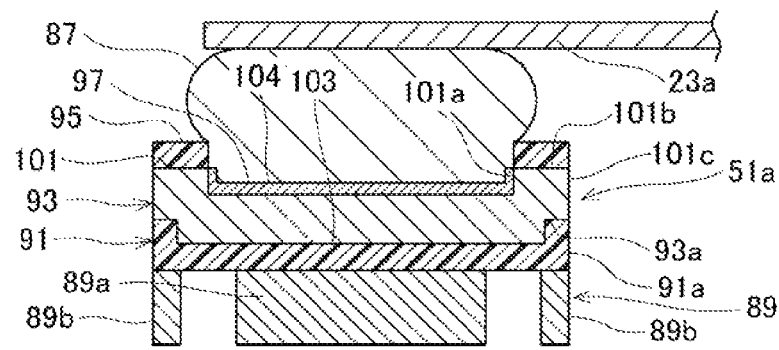
FIG. 16 is a sectional view on a plane corresponding to the plane taken along the line B-B of FIG. 8 according to the second modification of the first embodiment.

FIGS. 15 and 16 illustrate a second modification of the first embodiment. FIG. 15 is a sectional view on a plane corresponding to the plane taken along the line A-A of FIG. 8 and FIG. 16 is a sectional view on a plane corresponding to the plane taken along the line B-B of FIG. 8. In the second modification, the basic structure is referred to that of the first or second reference example or the first embodiment, and corresponding parts or components are represented with the same reference numerals as those of the first or second reference example or the first embodiment to eliminate duplicate explanation. Further, a difference between the second modification and the first embodiment will be mainly explained and explanation will be provided mainly for the internal terminal 51a of FIGS. 15 and 16.

The second modification is an application to the flexure manufactured by, for example, a semi-additive method.

The first embodiment of FIGS. 11 and 12 forms the terminal base insulating layer 91 and the island portion 89a to have the width in the side-by-side direction narrower than that of the terminal layer 93. In contrast, the second modification of FIGS. 15 and 16 elongates the outer edge portions 91 of the terminal base insulating layer 91 and the island portion 89a so that the terminal base insulating layer 91 has a width in the side-by-side direction wider than that of the terminal layer 93.

The second modification of the first embodiment, therefore, fully supports the lower surface 93a of the terminal layer 93 with the outer edge portions 91a of the terminal base insulating layer 91 and the island portion 89a of the terminal metal support layer 89.

Further, the second modification of the first embodiment provides the same effect as the first embodiment according to the wall 101 and the recessed portion 104.

Figure 17:
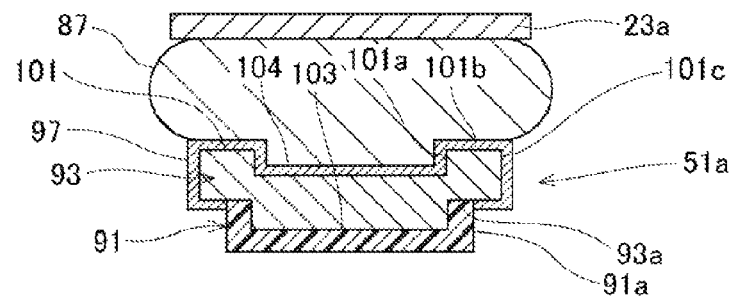
FIG. 17 is a sectional view on a plane corresponding to the plane taken along the line A-A of FIG. 8 according to a third modification of the first embodiment.
Figure 18:
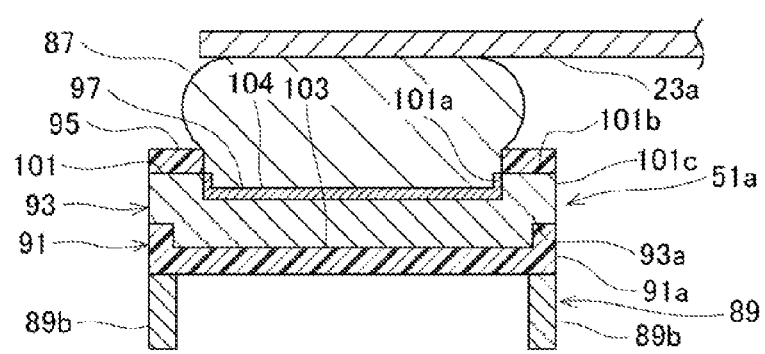
FIG. 18 is a sectional view on a plane corresponding to the plane taken along the line B-B of FIG. 8 according to the third modification of the first embodiment.

FIGS. 17 and 18 illustrate a third modification of the first embodiment. FIG. 17 is a sectional view on a plane corresponding to the plane taken along the line A-A of FIG. 8 and FIG. 18 is a sectional view on a plane corresponding to the plane taken along the line B-B of FIG. 8. In the third modification, the basic structure is referred to that of the first or second reference example or the first embodiment, and corresponding parts or components are represented with the same reference numerals as those of the first or second reference example or the first embodiment to eliminate duplicate explanation. Further, a difference between the third modification and the first embodiment will be mainly explained and explanation will be provided mainly for the internal terminal 51a of FIGS. 17 and 18.

The third modification is an application to the flexure manufactured by, for example, a semi-additive method.

The first embodiment of FIGS. 11 and 12 has the island portion 89a of the terminal metal support layer 89 whereas the third modification of FIGS. 17 and 18 omits the island portion 89a.

The third modification of the first embodiment, therefore, improves resilience of the internal terminals 51a . . . and reduces in weight.

Further, the third modification of the first embodiment provides the same effect as the first embodiment according to the wall 101 and the recessed portion 104.

Figure 19:
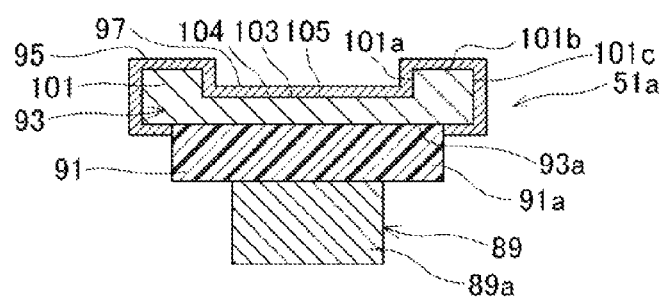
FIG. 19 is a sectional view on a plane corresponding to the plane taken along the line A-A of FIG. 8 according to a fourth modification of the first embodiment.
Figure 20:
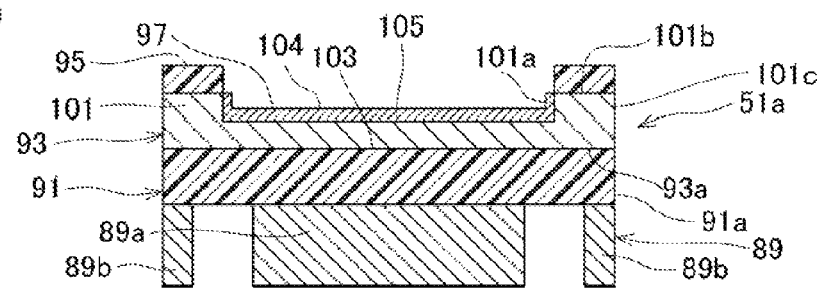
FIG. 20 is a sectional view on a plane corresponding to the plane taken along the line B-B of FIG. 8 according to the fourth modification of the first embodiment.

FIGS. 19 and 20 illustrate a fourth modification of the first embodiment. FIG. 19 is a sectional view on a plane corresponding to the plane taken along the line A-A of FIG. 8 and FIG. 20 is a sectional view on a plane corresponding to the plane taken along the line B-B of FIG. 8. In the fourth modification, the basic structure is referred to that of the first or second reference example or the first embodiment, and corresponding parts or components are represented with the same reference numerals as those of the first or second reference example or the first embodiment to eliminate duplicate explanation. Further, a difference between the fourth modification and the first embodiment will be mainly explained and explanation will be provided mainly for the internal terminal 51a of FIGS. 19 and 20.

The fourth modification is an application to the flexure manufactured by, for example, a subtractive method.

The first embodiment of FIGS. 11 and 12 has the thin portion 103 being the central portion of the terminal base insulating layer 91 thinned relative to the other portion thereof to relatively define the wall 101 and the recessed portion 104. In contrast, the fourth modification of FIGS. 19 and 20 forms a thin portion 105 on the terminal layer 93, the thin portion 105 being the central portion of the terminal layer 93 thinned relative to the other portion. With this thin portion 105, the wall 101 and the recessed portion 104 are relatively defined on the internal terminal 51a.

The width of the central portion of the terminal layer 93 in the A-A cross-section of FIG. 19 is narrower than that in the B-B cross-section of FIG. 20 so that the wall 101 forms a rectangular frame in a plan view. Inside the wall 101, the recessed portion 104 is defined to trap the solder material.

The thin portion 105 of the central portion of the terminal layer 93 is realized by partial etching for copper.

The fourth modification of the first embodiment, therefore, provides the same effect as the first embodiment according to the wall 101 and the recessed portion 104.

Further, the formation the wall 101 is easy to be formed just by the formation of the thin portion 105 according to the partial etching to shape the terminal layer 93.

The terminal layer 93 is supported with the terminal base insulating layer 91 having the sufficient thickness similar to the related art.

Figure 21:
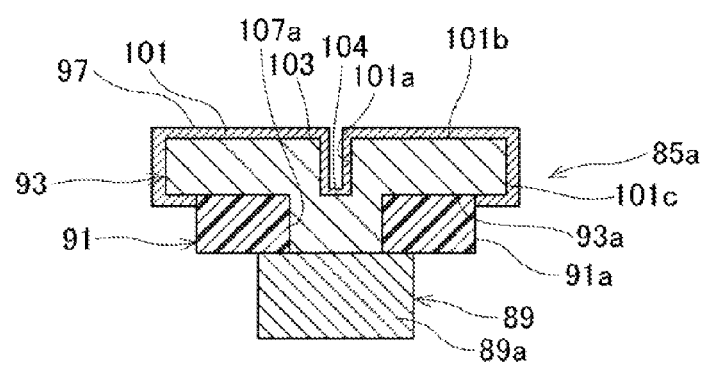
FIG. 21 is a sectional view on a plane corresponding to the plane taken along the line A-A of FIG. 8 according to a fifth modification of the first embodiment.
Figure 22:
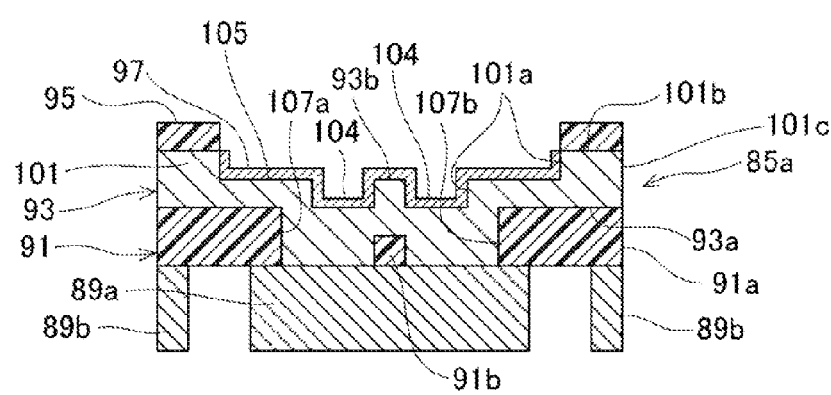
FIG. 22 is a sectional view on a plane corresponding to the plane taken along the line B-B of FIG. 8 according to the fifth modification of the first embodiment.

FIGS. 21 and 22 illustrate a fifth modification of the first embodiment. FIG. 21 is a sectional view on a plane corresponding to the plane taken along the line A-A of FIG. 8 and FIG. 22 is a sectional view on a plane corresponding to the plane taken along the line B-B of FIG. 8. In the fifth modification, the basic structure is referred to that of the first or second reference example or the first embodiment, and corresponding parts or components are represented with the same reference numerals as those of the first or second reference example or the first embodiment to eliminate duplicate explanation. Further, a difference between the fifth modification and the first embodiment will be mainly explained and explanation will be provided mainly for the internal terminal 85a as a ground terminal of FIGS. 21 and 22. The other internal terminals 51a, 53a, 55a, 57a, 59a, 61a, 79a, 81a and 83a have the same structure as the internal terminal 51a of any one of the first embodiment and the first to fourth modifications.

The fourth modification is an application to the flexure manufactured by, for example, a semi-additive method.

The first embodiment of FIGS. 11 and 12 has the thin portion 103 being the central portion of the terminal base insulating layer 91 thinned relative to the other portion thereof to define the wall 101 and the recessed portion 104. In contrast, the fifth modification of FIGS. 21 and 22 forms via holes 107a and 107b of a ground portion as holes without a thin portion formed on the terminal base insulating layer 91 for the internal terminal 85a as the ground terminal. With this configuration, the wall 101 and the recessed portion 104 are defined on the internal terminal 85a.

The A-A cross-section of FIG. 21 indicates only one via hole 107a of the via holes 107a and 107b that are simultaneously indicated in the B-B cross-section of FIG. 22. The via hole 107a is filled with the terminal layer 93. The portion of the terminal layer 93 within the via hole 107a is grounded to the island portion 89a of the terminal support layer 89. On the central portion of the terminal layer 93, a stepped recessed portion 104 is formed. On both sides of the recessed portion 104, the wall 101 is positioned. The wall 101 has an elongated width in the A-A cross-section.

The via hole 107b not illustrated in the A-A cross-section of FIG. 21 has the same sectional structure as the via hole 107a.

In the B-B cross-section of FIG. 22, the via holes 107a and 107b are located so as to interpose therebetween a low wall 91b of the terminal base insulating layer 91 located at a center, thereby to remove a surrounding portion of the center of the terminal base insulating layer 91. The terminal layer 93 has a protrusion 93b formed at a center and recessed and recessed portions 104 interposing the protrusion 93*b* therebetween. The inner surface 101*a* of the wall 101 has a stepped shape.

The via holes 107*a* and 107*b* are formed by exposure, etching, laser processing or the like to shape the terminal base insulating layer 91. In the semi-additive method, the via holes 107*a* and 107*b* may be formed concurrently with the base insulating layer using a photomask. The same holds for other via holes of a flexure manufactured by different semi-additive methods.

The thin portion 105 of the terminal layer 93 is formed by partial etching for copper.

The fifth modification of the first embodiment, therefore, provides the same effect as the first embodiment according to the wall 101 and the recessed portion 104.

Further, the recessed portion 104 is stepwise deepened to enhance the function of the wall 101.

Figure 23:
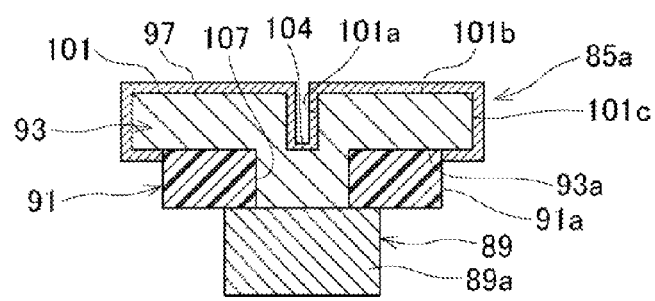
FIG. 23 is a sectional view on a plane corresponding to the plane taken along the line A-A of FIG. 8 according to a sixth modification of the first embodiment.
Figure 24:
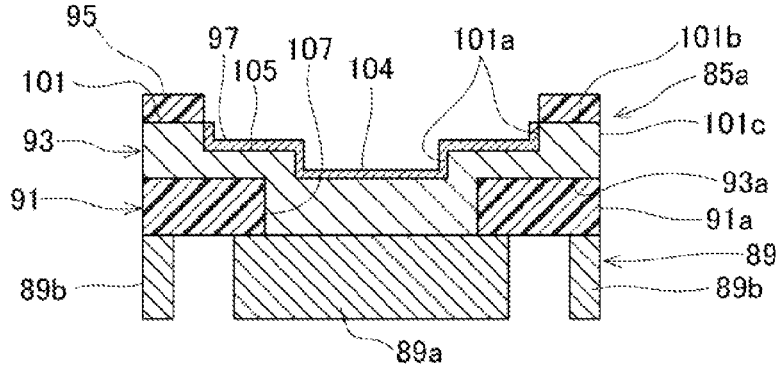
FIG. 24 is a sectional view on a plane corresponding to the plane taken along the line B-B of FIG. 8 according to the sixth modification of the first embodiment.

FIGS. 23 and 24 illustrate a sixth modification of the first embodiment. FIG. 23 is a sectional view on a plane corresponding to the plane taken along the line A-A of FIG. 8 and FIG. 24 is a sectional view on a plane corresponding to the plane taken along the line B-B of FIG. 8. In the sixth modification, the basic structure is referred to that of the first or second reference example or the first embodiment, and corresponding parts or components are represented with the same reference numerals as those of the first or second reference example or the first embodiment to eliminate duplicate explanation. Further, a difference between the sixth modification and the first embodiment will be mainly explained and explanation will be provided for an application to the internal terminal 85*a* as a ground terminal of FIGS. 23 and 24.

The sixth modification is an application to the flexure manufactured by, for example, a semi-additive method.

The first embodiment of FIGS. 11 and 12 has the thin portion 103 being the central portion of the terminal base insulating layer 91 thinned relative to the other portion thereof to define the wall 101 and the recessed portion 104. In contrast, the sixth modification of FIGS. 23 and 24 forms a via hole 107 of a ground portion as a hole without a thin portion formed on the terminal base insulating layer 91 for the internal terminal 85*a* as the ground terminal. With this configuration, the wall 101 and the recessed portion 104 are defined on the internal terminal 85*a*.

The via hole 107 is elongated relative to the via holes 107*a* and 107*b* of the fifth modification as illustrated in the B-B cross-section of FIG. 24.

In the A-A cross-section of FIG. 23, the terminal layer 93 has a portion filling the via hole 107 to define the recessed portion 104 on the central portion to trap the solder material and the wall 101 has an enlarged width.

In the B-B cross-section of FIG. 24, the via holes 107 has a wider width than in the A-A cross-section of FIG. 23 and the terminal layer 93 has the thin portion 105 on each side of the central portion of the terminal layer 93, the thin portion 105 thinned relative to the other portion of the terminal layer 93. The recessed portion 104 is stepwise formed so that both sides are shallower than the central portion of the terminal layer 43.

The via hole 107 is processed with laser processing or the like. The thin portion 105 of the terminal layer 93 is formed by partial etching for copper.

The sixth modification of the first embodiment, therefore, provides the same effect as the first embodiment according to the wall 101 and the recessed portion 104.

Further, the sixth modification also provides the same effect as the fifth modification.

Figure 25:
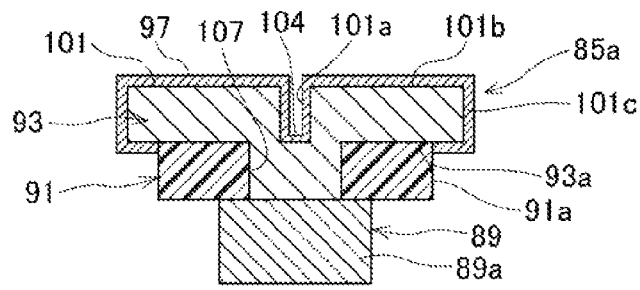
FIG. 25 is a sectional view on a plane corresponding to the plane taken along the line A-A of FIG. 8 according to a seventh modification of the first embodiment.
Figure 26:
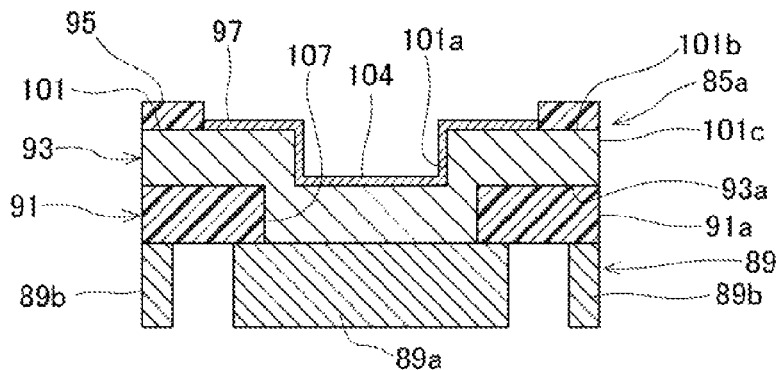
FIG. 26 is a sectional view on a plane corresponding to the plane taken along the line B-B of FIG. 8 according to the seventh modification of the first embodiment.

FIGS. 25 and 26 illustrate a seventh modification of the first embodiment. FIG. 25 is a sectional view on a plane corresponding to the plane taken along the line A-A of FIG. 8 and FIG. 26 is a sectional view on a plane corresponding to the plane taken along the line B-B of FIG. 8. In the seventh modification, the basic structure is referred to that of the first or second reference example, the first embodiment or the sixth modification, and corresponding parts or components are represented with the same reference numerals as those of the first or second reference example, the first embodiment or the sixth modification to eliminate duplicate explanation. Further, a difference between the seventh modification and the sixth modification and the first embodiment will be mainly explained and explanation will be provided mainly for the internal terminal 85*a* as a ground terminal of FIGS. 25 and 26.

The sixth modification of FIGS. 23 and 24 thins the side portions on the both sides of the central portion of the terminal layer 93 by partial etching to have the thin portions 105. In contrast, the seventh modification of FIGS. 25 and 26 has no thin portion 105 so that the side portions have substantially the same thickness as the central portion of the terminal layer 93.

The seventh modification of the first embodiment, therefore, omits the partial etching.

Further, the seventh modification of the first embodiment fully supports the lower surface 93*a* of the terminal layer 93 with the outer edge portions 91*a* of the terminal base insulating layer 91 and the island portion 89*a* of the terminal metal support layer 89.

Further, the seventh modification of the first embodiment provides the same effect as the first embodiment according to the wall 101 and the recessed portion 104.

Figure 27:
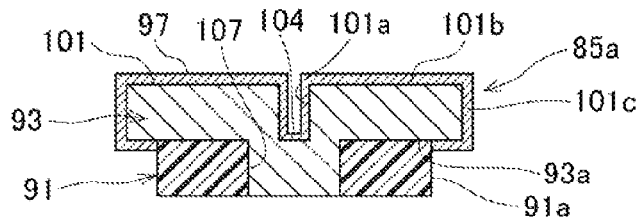
FIG. 27 is a sectional view on a plane corresponding to the plane taken along the line A-A of FIG. 8 according to an eighth modification of the first embodiment.
Figure 28:
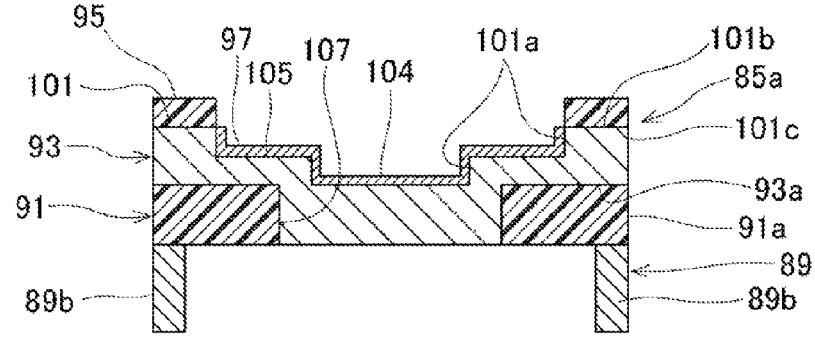
FIG. 28 is a sectional view on a plane corresponding to the plane taken along the line B-B of FIG. 8 according to the eighth modification of the first embodiment.

FIGS. 27 and 28 illustrate an eighth modification of the first embodiment. FIG. 27 is a sectional view on a plane corresponding to the plane taken along the line A-A of FIG. 8 and FIG. 28 is a sectional view on a plane corresponding to the plane taken along the line B-B of FIG. 8. In the eighth modification, the basic structure is referred to that of the first or second reference example, the first embodiment or the sixth modification, and corresponding parts or components are represented with the same reference numerals as those of the first or second reference example, the first embodiment or the sixth modification to eliminate duplicate explanation. Further, a difference between the eighth modification and the sixth modification and the first embodiment will be mainly explained and explanation will be provided mainly for the internal terminal 85*a* as a ground terminal of FIGS. 27 and 28.

The sixth modification of FIGS. 23 and 24 has the island portion 89*a* of the terminal metal support layer 89 whereas the eighth modification of FIGS. 27 and 28 omits the island portion 89*a*.

The eighth modification of the first embodiment, therefore, improves resilience of the terminal 85*a* and reduces in weight.

Further, the eighth modification of the first embodiment provides the same effect as the first embodiment according to the wall 101 and the recessed portion 104.

Figure 29:
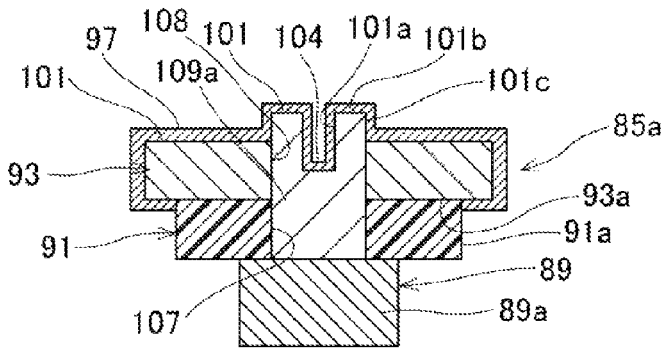
FIG. 29 is a sectional view on a plane corresponding to the plane taken along the line A-A of FIG. 8 according to a ninth modification of the first embodiment.
Figure 30:
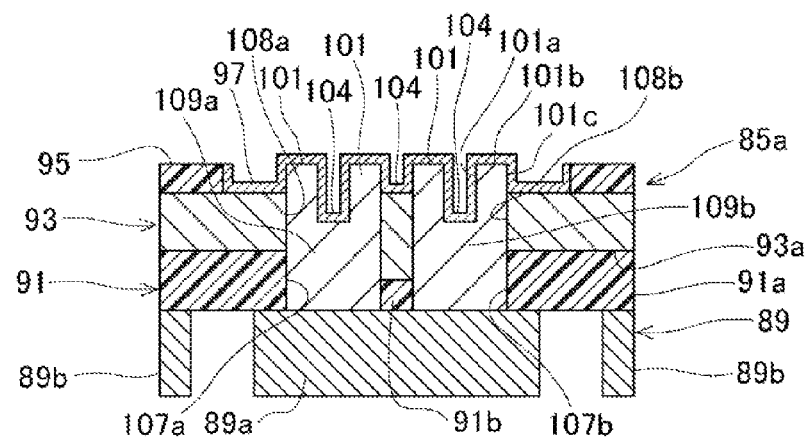
FIG. 30 is a sectional view on a plane corresponding to the plane taken along the line B-B of FIG. 8 according to the ninth modification of the first embodiment.

FIGS. 29 and 30 illustrate a ninth modification of the first embodiment. FIG. 29 is a sectional view on a plane corresponding to the plane taken along the line A-A of FIG. 8 and FIG. 30 is a sectional view on a plane corresponding to the plane taken along the line B-B of FIG. 8. In the ninth modification, the basic structure is referred to that of the first or second reference example or the first embodiment, and corresponding parts or components are represented with the same reference numerals as those of the first or second reference example or the first embodiment to eliminate duplicate explanation. Further, a difference between the ninth modification and the first embodiment will be mainly explained and explanation will be provided mainly for the internal terminal 85*a* as a ground terminal of FIGS. 29 and 30.

The first embodiment of FIGS. 11 and 12 has the thin portion 103 being the central portion of the terminal base insulating layer 91 thinned relative to the other portion thereof to define the wall 101 and the recessed portion 104. In contrast, the ninth modification of FIGS. 29 and 30 forms two sets of via holes 107*a*, 108*a*; and 107*b*, 108*b* of a ground portion as holes without a thin portion formed on the terminal base insulating layer 91 for the internal terminal 85*a*. Into the via holes 107*a*, 108*a*; and 107*b*, 108*b*, ground portions 109*a* and 109*b* are formed by nickel plating to provide the wall 101 and the recessed portion 104.

Namely, the wall 101 is formed on each one of the ground portions 109*a* and 109*b* that pass through the terminal base insulating layer 91 of the base insulating layer and the terminal layer 93 of the wiring layer 99 and are grounded to the terminal metal support layer 89 as the metal support layer.

In the A-A cross-section of FIG. 29, only one ground portion 109*a* that is formed in the first set of the via holes 107*a* and 108*a* is indicated. The ground portion 109*a* is grounded to the island portion 89*a* of the terminal metal support layer 89. On the central portion of the ground portion 109*a*, the recessed portion 104 is formed. Around the recessed portion 104, the wall 101 is located.

The second set of the via holes 107*b* and 108*b* not illustrated in the A-A cross-section of FIG. 29 have the same structure as the first set of the via holes 107*a* and 108*a*.

In the B-B cross-section of FIG. 30, the sets of the via holes 107*a* and 108*a*; and 107*b* and 108*b* are located so as to interpose therebetween a low wall 91*b* of the terminal base insulating layer 91 located at the center. In the sets of the vie holes 107*a* and 108*a*; and 107*b* and 108*b*, the ground portions 109*a* and 109*b* are formed, respectively.

The sets of the via holes 107*a* and 108*a*; and 107*b* and 108*b* are formed by laser processing or the like to shape the terminal layer 93 and the terminal base insulating layer 91. Further, via holes may be formed by partly removing copper of the terminal layer 93 using etching and by etching or laser processing to shape the terminal base insulating layer 91. The ground portions 109*a* and 109*b* are formed in a masking condition using a photomask.

The ninth modification of the first embodiment provides the same effect as the first embodiment according to the wall 101 and the recessed portion 104.

Further, the wall 101 and the recessed portion 104 are easily formed by nickel plating to shape the ground portions 109*a* and 109*b* without increase in the number of the process steps.

Figure 31:
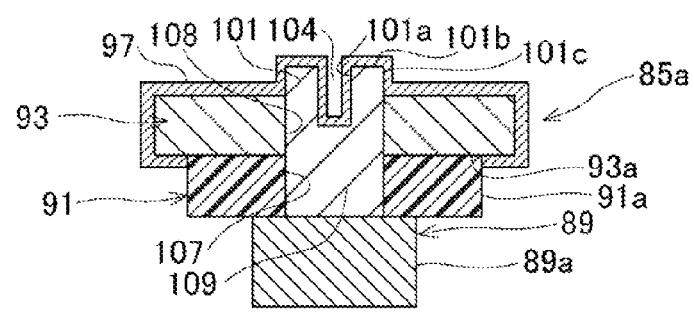
FIG. 31 is a sectional view on a plane corresponding to the plane taken along the line A-A of FIG. 8 according to a tenth modification of the first embodiment.
Figure 32:
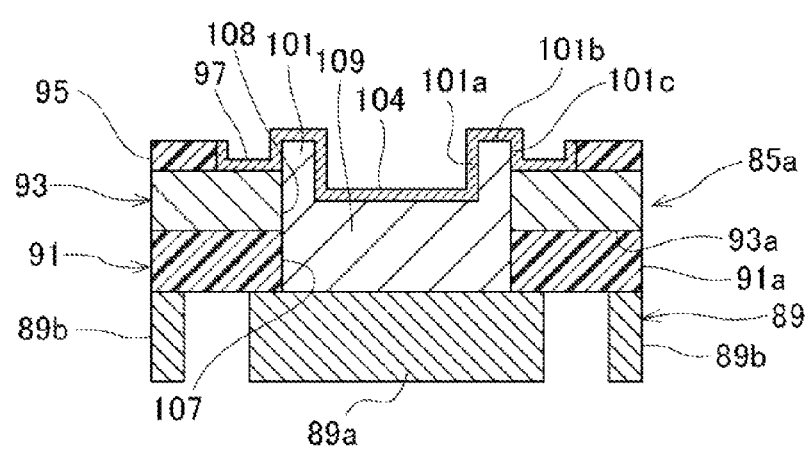
FIG. 32 is a sectional view on a plane corresponding to the plane taken along the line B-B of FIG. 8 according to the tenth modification of the first embodiment.

FIGS. 31 and 32 illustrate a tenth modification of the first embodiment. FIG. 31 is a sectional view on a plane corresponding to the plane taken along the line A-A of FIG. 8 and FIG. 32 is a sectional view on a plane corresponding to the plane taken along the line B-B of FIG. 8. In the tenth modification, the basic structure is referred to that of the first or second reference example, the first embodiment or the ninth modification, and corresponding parts or components are represented with the same reference numerals as those of the first or second reference example, the first embodiment or the ninth modification to eliminate duplicate explanation. Further, a difference between the tenth modification and the ninth modification and the first embodiment will be mainly explained and explanation will be provided mainly for the internal terminal 85*a* as a ground terminal of FIGS. 31 and 32.

The first embodiment of FIGS. 11 and 12 has the thin portion 103 being the central portion of the terminal base insulating layer 91 thinned relative to the other portion thereof to form the wall 101 and the recessed portion 104. In contrast, the tenth modification of FIGS. 31 and 32 forms via holes 107 and 108 of a ground portion as holes without a thin portion formed on the terminal base insulating layer 91 for the internal terminal 85*a* as the ground terminal. Into the via holes 107 and 108, a ground portion 109 is formed by nickel plating to provide the wall 101 and the recessed portion 104.

Namely, the wall 101 is formed on the ground portion 109 that passes through the terminal base insulating layer 91 of the base insulating layer and the terminal layer 93 of the wiring layer 99.

The via holes 107 and 108 form a single elongated hole that is different from the sets of via holes 107*a* and 108*a*; and 107*b* and 108*b* of the ninth modification. The others are the same as the ninth modification.

The tenth modification of the first embodiment, therefore, provides the same effect as the first embodiment according to the wall 101 and the recessed portion 104.

Figure 33:
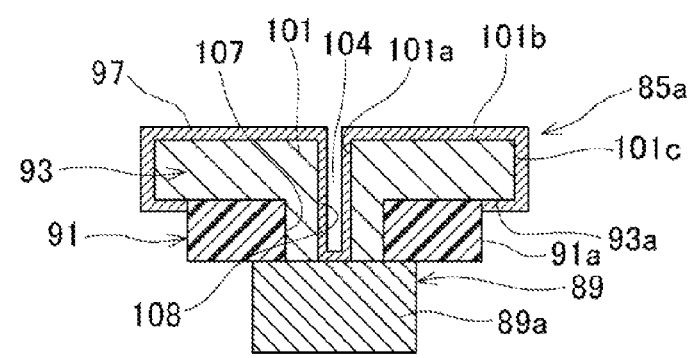
FIG. 33 is a sectional view on a plane corresponding to the plane taken along the line A-A of FIG. 8 according to a eleventh modification of the first embodiment.
Figure 34:
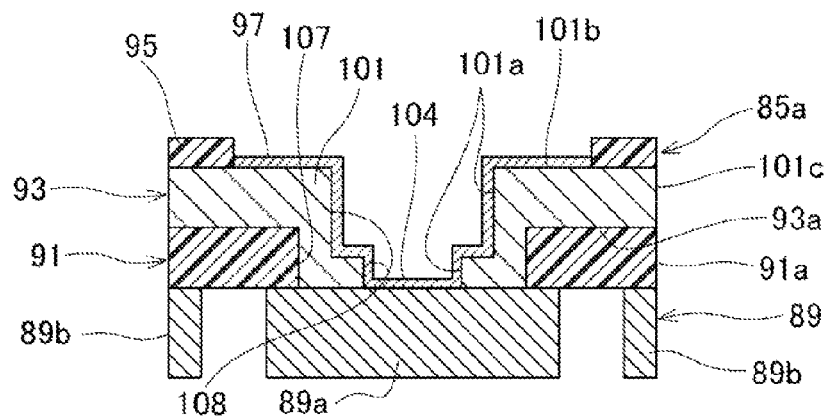
FIG. 34 is a sectional view on a plane corresponding to the plane taken along the line B-B of FIG. 8 according to the eleventh modification of the first embodiment.

FIGS. 33 and 34 illustrate an eleventh modification of the first embodiment. FIG. 33 is a sectional view on a plane corresponding to the plane taken along the line A-A of FIG. 8 and FIG. 34 is a sectional view on a plane corresponding to the plane taken along the line B-B of FIG. 8. In the eleventh modification, the basic structure is referred to that of the first or second reference example or the first embodiment, and corresponding parts or components are represented with the same reference numerals as those of the first or second reference example or the first embodiment to eliminate duplicate explanation. Further, a difference between the eleventh modification and the first embodiment will be mainly explained and explanation will be provided for the internal terminal 85*a* as a ground terminal of FIGS. 33 and 34.

The eleventh modification is an application to the flexure manufactured by, for example, a semi-additive method.

The first embodiment of FIGS. 11 and 12 has the thin portion 103 being the central portion of the terminal base insulating layer 91 thinned relative to the other portion thereof to form the wall 101 and the recessed portion 104. In contrast, the eleventh modification of FIGS. 33 and 34 forms a via hole 107 of a ground portion as a hole on the terminal base insulating layer 91 without a thin portion formed on the terminal base insulating layer 91 for the internal terminal 85*a* as the ground terminal. A portion of a terminal layer 93 fills the via hole 107 to provide the wall 101 and the recessed portion 104. The via hole 107 is the single hole.

As illustrated in the A-A cross-section of FIG. 33 and the B-B cross-section of FIG. 34, the portion of the terminal layer 93 filling the via hole 107 is grounded to the island portion 89*a* of the terminal metal support layer 89. A central via hole 108 is formed at the center of the terminal layer 93 to define the stepped recessed portion 104 for trapping the solder material and the wall 101 around the recessed portion 104. The gold plate 97 is extended over the surface of the terminal layer 93 including the inner surface and the bottom surface of the central via hole 108. The terminal layer 93 and the gold plate 97 are grounded to the island portion 89a of the terminal metal support layer 89.

The via hole 107 is formed by laser processing or etching to shape the terminal base insulating layer 91. The via hole 108 is formed by partly removing copper of the terminal layer 93 using etching or shaping the terminal layer 93 using laser processing.

The eleventh modification of the first embodiment, therefore, provides the same effect as the first embodiment according to the wall 101 and the recessed portion 104.

Further, the eleventh modification of the first embodiment has the deeper recessed portion 104 than of the aforementioned embodiment and modifications, to enhance the function of the wall 101.

Hereinafter, the second embodiment of the present invention will be explained.

Figure 35:
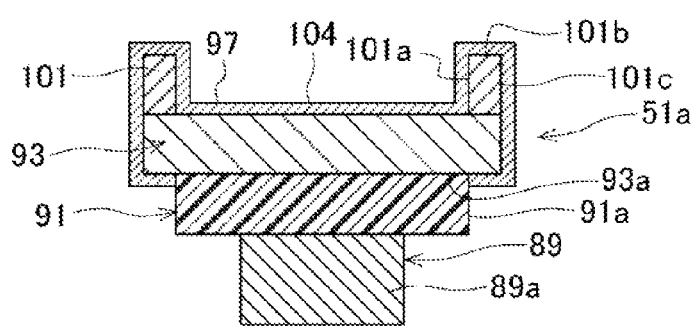
FIG. 35 is a sectional view on a plane corresponding to the plane taken along the line A-A of FIG. 8 according to a second embodiment of the present invention.
Figure 36:
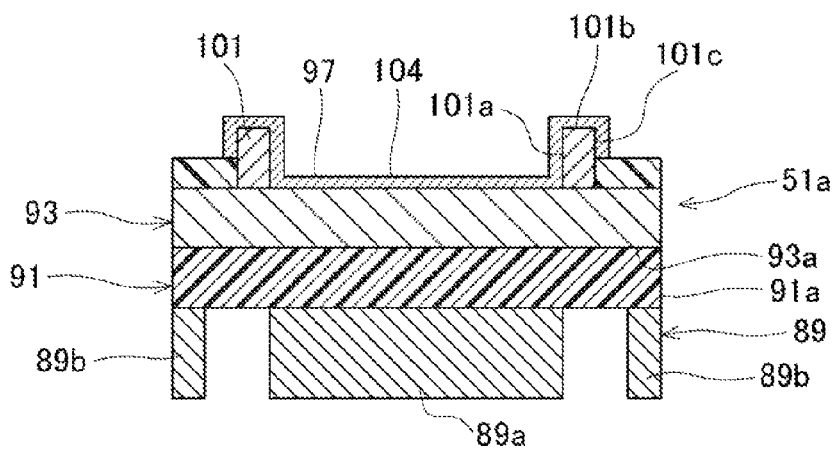
FIG. 36 is a sectional view on a plane corresponding to the plane taken along the line B-B of FIG. 8 according to the second embodiment.

FIGS. 35 and 36 relate to the second embodiment of the present invention. FIG. 35 is a sectional view on a plane corresponding to the plane taken along the line A-A of FIG. 8 and FIG. 36 is a sectional view on a plane corresponding to the plane taken along the line B-B of FIG. 8. In the second embodiment, the basic structure is referred to that of the first or second reference example or the first embodiment, and corresponding parts or components are represented with the same reference numerals as those of the first or second reference example or the first embodiment to eliminate duplicate explanation. Further, a difference between the second embodiment and the first embodiment will be mainly explained and explanation will be provided mainly for the internal terminal 51a of FIGS. 35 and 36.

The first embodiment of FIGS. 11 and 12 has the thin portion 103 being the central portion of the terminal base insulating layer 91 thinned relative to the other portion thereof to form the wall 101 and the recessed portion 104. In contrast, the second embodiment of FIGS. 35 and 36 adds a protrusion around the central portion of the terminal layer 93 to form the wall 101 and the recessed portion 104.

As illustrated in FIGS. 35 and 36, the wall 101 as the protrusion protrudes from the terminal surface of the terminal layer 93 and surrounds the central portion of the terminal layer 93. On the terminal layer 93, the recessed portion 104 surrounded by the wall 101 is defined. The gold plate 97 coats the terminal layer 93 together with the wall 101.

The wall 101 is formed concurrently with a ground portion of nickel that is formed under a masked condition using a photomask like the ninth and tenth modifications of the first embodiment.

According to this embodiment, the terminal base insulating layer 91 and the terminal layer 93 have no hole unlike the internal terminal 85a as the ground terminal and therefore the wall 101 is raised on the terminal layer 93 when the wall 101 is formed by nickel plating simultaneously with the ground portion.

The second embodiment, therefore, provides the same effect as the first embodiment according to the wall 101 and the recessed portion 104.

The wall 101 protruding from the terminal surface of the terminal layer 93 reduces a gap relative to an opposite one of the external terminals 23a . . . to enhance the function of the wall 101 and the recessed portion 104.

The wall 101 is easily formed simultaneously with the ground portion that is formed by nickel plating.

Hereinafter, first to third modifications according to the second embodiment will be explained.

Figure 37:
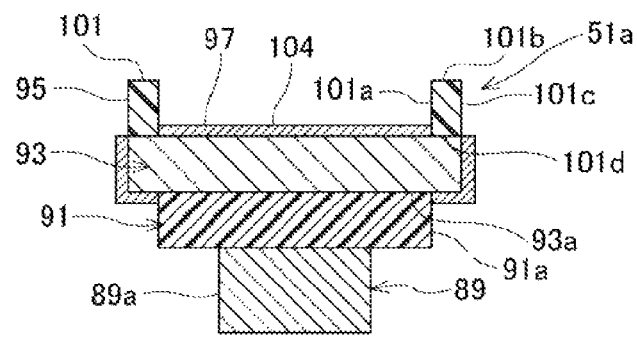
FIG. 37 is a sectional view on a plane corresponding to the plane taken along the line A-A of FIG. 8 according to a first modification of the second embodiment.
Figure 38:
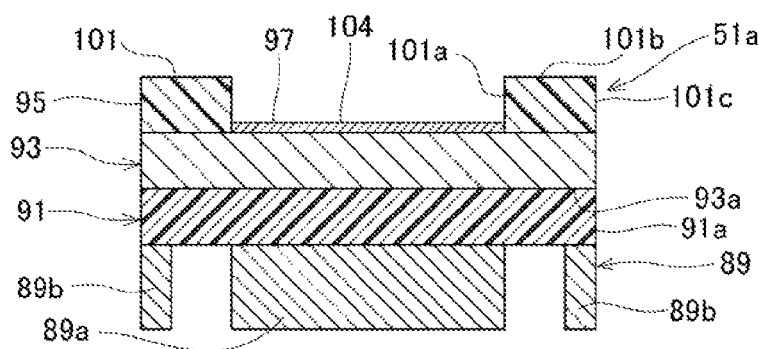
FIG. 38 is a sectional view on a plane corresponding to the plane taken along the line B-B of FIG. 8 according to the first modification of the second embodiment.

FIGS. 37 and 38 illustrate a first modification of the second embodiment. FIG. 37 is a sectional view on a plane corresponding to the plane taken along the line A-A of FIG. 8 and FIG. 38 is a sectional view on a plane corresponding to the plane taken along the line B-B of FIG. 8. In the first modification, the basic structure is referred to that of the first or second reference example or the second embodiment, and corresponding parts or components are represented with the same reference numerals as those of the first or second reference example or the first or second embodiment to eliminate duplicate explanation. Further, a difference between the first modification and the first or second embodiment will be mainly explained and explanation will be provided mainly for the internal terminal 51a of FIGS. 37 and 38.

The first embodiment of FIGS. 11 and 12 has the thin portion 103 being the central portion of the terminal base insulating layer 91 thinned relative to the other portion thereof to form the wall 101 and the recessed portion 104. In contrast, the first modification of FIGS. 37 and 38 integrally forms the wall 101 to the terminal cover insulating layer 95 to define the recessed portion 104.

As illustrated in FIGS. 37 and 38, the wall 101 surrounds the terminal surface of the central portion of the terminal layer 93.

The wall 101 is integrally formed to the terminal cover insulating layer 95 with the same insulating material so as to protrude from the terminal surface of the terminal layer 93.

As the method of forming the wall 101, insulating material is applied on the terminal layer 93 so as to have a height including the wall 101 at the terminal cover insulating layer 95 and then processing such as exposure, etching or laser processing is conducted to expose the terminal surface of the terminal layer 93 outside.

The first modification of the second embodiment, therefore, provides the same effect as the first or second embodiment according to the wall 101 and the recessed portion 104.

Further, the first modification of the second embodiment forms the wall 101 and the recessed portion 104 by etching or the like to shape the terminal cover insulating layer 95.

Figure 39:
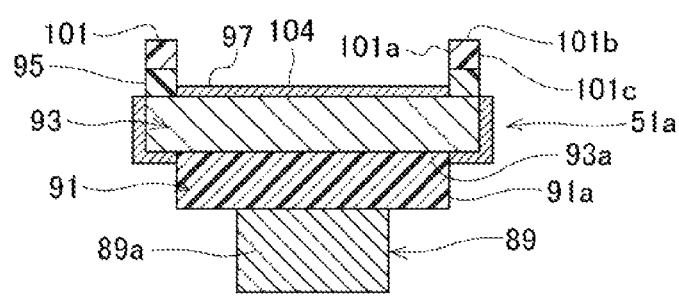
FIG. 39 is a sectional view on a plane corresponding to the plane taken along the line A-A of FIG. 8 according to a second modification of the second embodiment.
Figure 40:
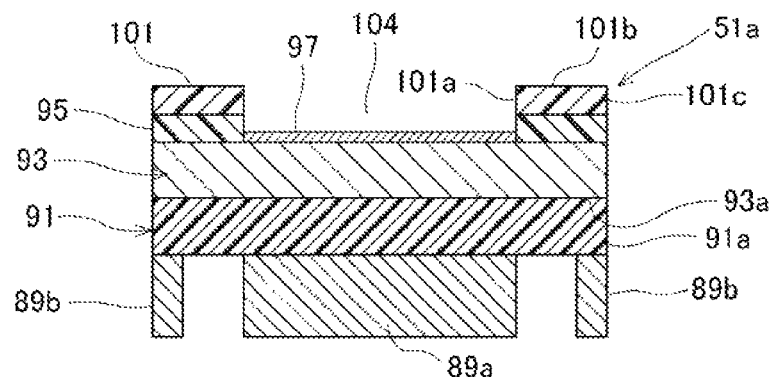
FIG. 40 is a sectional view on a plane corresponding to the plane taken along the line B-B of FIG. 8 according to the second modification of the second embodiment.

FIGS. 39 and 40 illustrate a second modification of the second embodiment. FIG. 39 is a sectional view on a plane corresponding to the plane taken along the line A-A of FIG. 8 and FIG. 40 is a sectional view on a plane corresponding to the plane taken along the line B-B of FIG. 8. In the second modification, the basic structure is referred to that of the first or second reference example or the first or second embodiment, and corresponding parts or components are represented with the same reference numerals as those of the first or second reference example or the first or second embodiment to eliminate duplicate explanation. Further, a difference between the second modification and the first or second embodiment will be mainly explained and explanation will be provided mainly for an internal terminal 51a of FIGS. 39 and 40.

The first embodiment of FIGS. 11 and 12 has the thin portion 103 being the central portion of the terminal base insulating layer 91 thinned relative to the other portion thereof to form the wall 101 and the recessed portion 104. In contrast, the second modification of FIGS. 39 and 40 forms the wall 101 and the recessed portion 104 using the terminal cover insulating layer 95 like the first modification of the second embodiment.

The wall 101 of the second modification of the second embodiment has a two-layer structure that is different from the single-layer structure of the first modification of the second embodiment. The others of the second modification are the same as of the first modification.

As a method of forming the two-layer wall 101, insulating layers are laid one on another at a portion corresponding to the terminal cover insulating layer 95 and then processing such as exposure, etching or laser processing is conducted to expose the terminal surface of the terminal layer 93 outside.

The second modification of the second embodiment, therefore, provides the same effect as the first embodiment according to the wall 101 and the recessed portion 104.

Further, the second modification of the second embodiment arranges the additional insulating layer (upper insulating layer) forming the wall 101 on only the terminal cover insulating layer 95.

Figure 41:
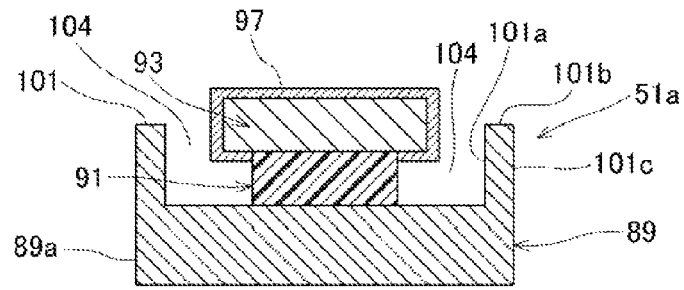
FIG. 41 is a sectional view on a plane corresponding to the plane taken along the line A-A of FIG. 8 according to a third modification of the second embodiment.
Figure 42:
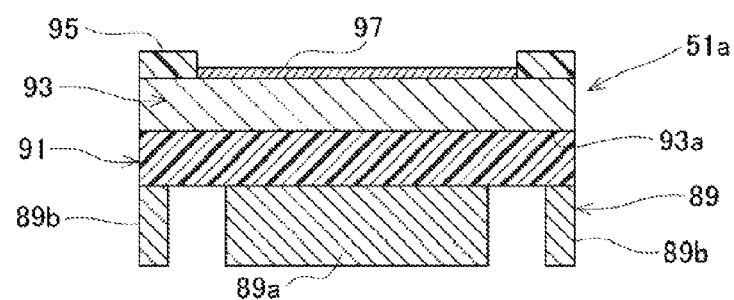
FIG. 42 is a sectional view on a plane corresponding to the plane taken along the line B-B of FIG. 8 according to the third modification of the second embodiment.

FIGS. 41 and 42 illustrate a third modification of the second embodiment. FIG. 41 is a sectional view on a plane corresponding to the plane taken along the line A-A of FIG. 8 and FIG. 42 is a sectional view on a plane corresponding to the plane taken along the line B-B of FIG. 8. In the third modification, the basic structure is referred to that of the first or second reference example or the second embodiment, and corresponding parts or components are represented with the same reference numerals as those of the first or second reference example or the first or second embodiment to eliminate duplicate explanation. Further, a difference between the third modification and the first or second embodiment will be mainly explained and explanation will be provided mainly for the internal terminal 51a of FIGS. 41 and 42.

The first embodiment of FIGS. 11 and 12 has the wall 101 and the recessed portion 104 based on the thin portion 103 being the central portion of the terminal base insulating layer 91 thinned relative to the other portion thereof. In contrast, the third modification of FIGS. 41 and 42 forms the wall 101 and the recessed portion 104 using part of the terminal metal support layer 89.

As a method of forming the wall 101, the terminal metal support layer 89 has a larger width than the second embodiment, and side edge portions of the terminal metal support layer 89 at least in the island portion 89a are formed thinner than the other portion thereof, bent and raised in the A-A cross-section of FIG. 41. With this, the wall 101 and the recessed portion 104 are formed. A height of the wall 101 is equivalent to a height of a middle of a terminal layer 93. The wall 101 keeps away from side portions of the terminal layer 93. The recessed portion 104 is open on both sides in the right-left direction of the B-B cross-section of FIG. 42. The wall 101 may be elongated from both sides of the island portion 89a toward the respective side walls 89b in the right-left direction of the B-B cross section.

The B-B cross section of FIG. 42 is the same as of FIG. 10 of the second reference example.

The third modification of the second embodiment, therefore, provides the same effect as the first embodiment according to the wall 101 and the recessed portion 104.

Further, the third modification of the second embodiment forms the wall 101 by bending the edge portions of the terminal metal support layer 89 to increase rigidity of the internal terminals 51 . . . .

Hereinafter, the third embodiment of the present invention will be explained.

Figure 43:
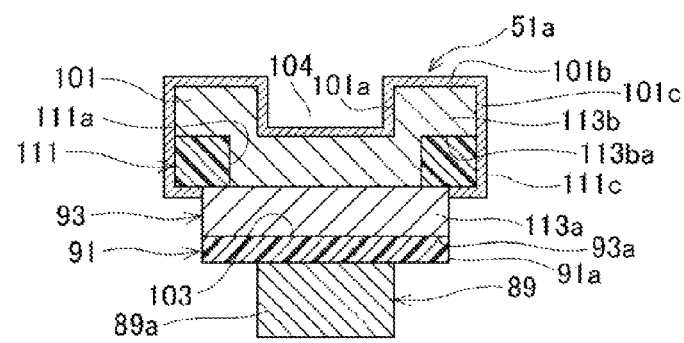
FIG. 43 is a sectional view on a plane corresponding to the plane taken along the line A-A of FIG. 8 according to a third embodiment of the present invention.
Figure 44:
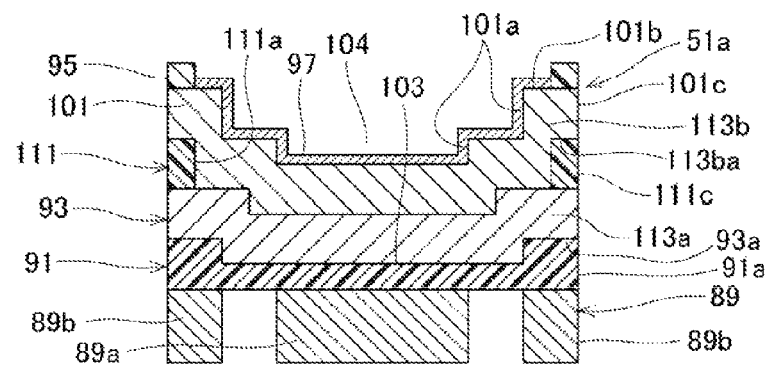
FIG. 44 is a sectional view on a plane corresponding to the plane taken along the line B-B of FIG. 8 according to the third embodiment.

FIGS. 43 and 44 relate to the third embodiment of the present invention. FIG. 43 is a sectional view on a plane corresponding to the plane taken along the line A-A of FIG. 8 and FIG. 44 is a sectional view on a plane corresponding to the plane taken along the line B-B of FIG. 8. In the third embodiment, the basic structure is referred to that of the first or second reference example or the first embodiment, and corresponding parts or components are represented with the same reference numerals as those of the first or second reference example or the first embodiment to eliminate duplicate explanation. Further, a difference between the third embodiment and the first embodiment will be mainly explained and explanation will be provided mainly for the internal terminal 51a of FIGS. 43 and 44.

The third embodiment is an application to the flexure having dual-layer wiring. The dual-layer wiring is employed to save space or improve an electric characteristic.

The first embodiment of FIGS. 11 and 12 has the thin portion 103 being the central portion of the terminal base insulating layer 91 thinned relative to the other portion thereof to form the wall 101 and the recessed portion 104. In contrast, the third embodiment of FIGS. 43 and 44 provides the dual-layer wiring with the thin portion 103 being the central portion of the terminal base insulating layer 91 thinned relative to the other portion thereof and a hole 111a being formed to an intermediate insulating layer 111, to form a wall 101 and a recessed portion 104.

As illustrated in the A-A cross-section of FIG. 43 and the B-B cross-section of FIG. 44, the internal terminal 51a has the terminal metal support layer 89, the terminal base insulating layer 91 provided on the surface of the terminal metal support layer 89, the terminal layer 93 formed on the surface of the terminal base insulating layer 91, the terminal cover insulating layer 95, the gold plate 97, and the intermediate insulating layer 111. The intermediate insulating layer 111 is part of the intermediate insulating layer of the wiring part. A nickel plate may be formed as a foundation for the gold plate 97. The terminal layer 93 includes a bottom copper layer 113a and a top copper layer 113b.

In the A-A cross-section of FIG. 43, the terminal layer 93 is formed on the thin portion 103 of the terminal base insulating layer 91 and the wall 101 surrounds a central portion of the top copper layer 113b to define the recessed portion 104.

Namely, the terminal layer 93 follows the surface of the thin portion 103 of the terminal base insulating layer 91. The top copper layer 113b, therefore, enters into the hole 111a of the intermediate insulating layer 111 and is connected to the bottom copper layer 113a. The wall 101 is in the form of a surround of the recessed portion 104 at the central portion of the top copper layer 113b.

In the B-B cross-section of FIG. 44, the recessed portion 104 has a stepped shape from the central portion of the top copper layer 113b toward both sides.

As illustrated in FIGS. 43 and 44, the wall 101 is supported with the intermediate insulating layer 111. Under the wall 101, an outer edge portions 111c of the intermediate insulating layer 111 are located to contact a lower surface 113ba of the top copper layer 113b. The outer edge portions 91a of the terminal base insulating layer 91 are located to contact the lower surface 93a of the bottom copper layer 113 being located under the outer edge portions 111c of the intermediate insulating layer 111. The side walls 89b of the terminal metal support layer 89 support the outer edge portions 91a of the terminal base insulating layer 91.

The thin portion 103 of the terminal base insulating layer 91 and the hole 111a of the intermediate insulating layer 111 are formed by exposure, etching, laser processing or the like.

The third embodiment, therefore, provides the same effect as the first embodiment according to the wall 101 and the recessed portion 104.

Further, the third embodiment has the deeper recessed portion 104 like the sixth modification of the first embodiment and the like, to enhance the function.

The wall 101 is easily formed by exposure, etching or the like to shape the terminal base insulating layer 91 and the intermediate insulating layer 111. The third embodiment allows the top copper layer 113*b* to have the sufficient thickness similar to the related art.

Hereinafter, first to sixth modifications according to the third embodiment will be explained.

Figure 45:
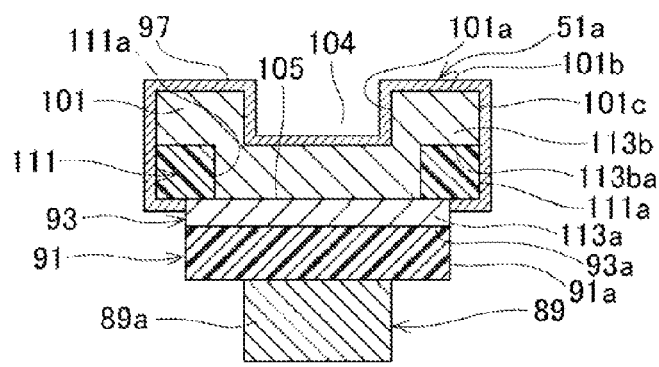
FIG. 45 is a sectional view on a plane corresponding to the plane taken along the line A-A of FIG. 8 according to a first modification of the third embodiment.
Figure 46:
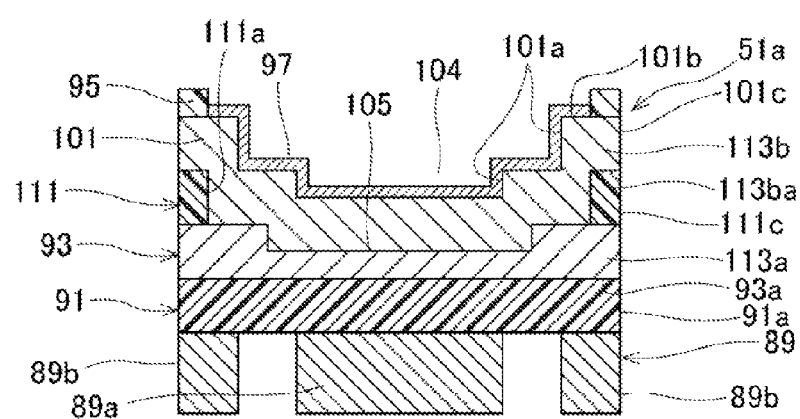
FIG. 46 is a sectional view on a plane corresponding to the plane taken along the line B-B of FIG. 8 according to the first modification of the third embodiment.

FIGS. 45 and 46 illustrate a first modification of the third embodiment. FIG. 45 is a sectional view on a plane corresponding to the plane taken along the line A-A of FIG. 8 and FIG. 46 is a sectional view on a plane corresponding to the plane taken along the line B-B of FIG. 8. In the first modification, the basic structure is referred to that of the first or second reference example or the first or third embodiment, and corresponding parts or components are represented with the same reference numerals as those of the first or second reference example or the first or third embodiment to eliminate duplicate explanation. Further, a difference between the first modification and the third embodiment will be mainly explained and explanation will be provided mainly for the internal terminal 51*a* of FIGS. 45 and 46.

The first modification of the third embodiment is an application to the flexure having the dual-layer wiring.

The third embodiment of FIGS. 43 and 44 has the thin portion 103 being the central portion of the terminal base insulating layer 91 thinned relative to the other portion thereof to form the wall 101 and the recessed portion 104. In contrast, the first modification of FIGS. 45 and 46 has, without a thin portion formed on the terminal base insulating layer 91, a thin portion 105 that is the central portion of the bottom copper layer 113*a* of the terminal layer 93 thinned relative to the other portion thereof and the hole 111*a* formed in the intermediate insulating layer 111, to define the wall 101 and the recessed portion 104. The others of the first modification are the same as of the third embodiment of FIGS. 43 and 44.

The thin portion 105 of the bottom copper layer 113*a* is formed by partial etching for copper.

The first modification of the third embodiment, therefore, provides the same effect as the first and third embodiments according to the wall 101 and the recessed portion 104.

Further, the first modification of the third embodiment easily forms the wall 101 by only partial etching to shape the bottom copper layer 113*a*.

The third embodiment supports the terminal layer 93 with the terminal base insulating layer 91 having a sufficient thickness similar to the related art.

Figure 47:
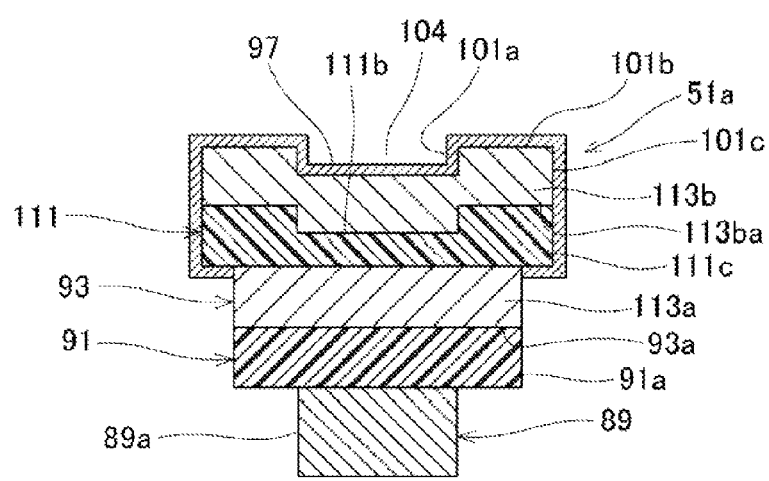
FIG. 47 is a sectional view on a plane corresponding to the plane taken along the line A-A of FIG. 8 according to a second modification of the third embodiment.
Figure 48:
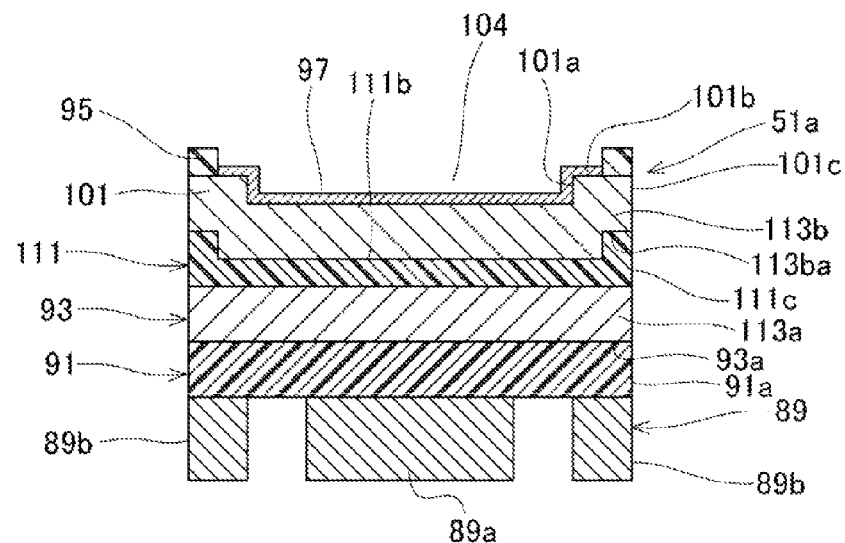
FIG. 48 is a sectional view on a plane corresponding to the plane taken along the line B-B of FIG. 8 according to the second modification of the third embodiment.

FIGS. 47 and 48 illustrate a second modification of the third embodiment. FIG. 47 is a sectional view on a plane corresponding to the plane taken along the line A-A of FIG. 8 and FIG. 48 is a sectional view on a plane corresponding to the plane taken along the line B-B of FIG. 8. In the second modification, the basic structure is referred to that of the first or second reference example or the first or third embodiment, and corresponding parts or components are represented with the same reference numerals as those of the first or second reference example or the first or third embodiment to eliminate duplicate explanation. A difference between the second modification and the third embodiment will be mainly explained and explanation will be provided mainly for the internal terminal 51*a* of FIGS. 47 and 48.

The second modification is an application to the flexure having the dual-layer wiring.

The third embodiment of FIGS. 43 and 44 has the thin portion 103 and the hole 111*a*, the thin portion 103 being the central portion of the terminal base insulating layer 91 thinned relative to the other portion thereof and the hole 111*a* formed in the intermediate insulating layer 111, to form the wall 101 and the recessed portion 104. In contrast, the second modification of FIGS. 47 and 48 forms a thin portion 111*b* that is the central portion of the intermediate insulating layer 111 thinned relative to the other portion thereof without a hole in the intermediate insulating layer 111, to form a wall 101 and a recessed portion 104 to trap solder material. The others of the second modification are the same as of the third embodiment of FIGS. 43 and 44.

The thin portion 111*b* of the intermediate insulating portion 111 is formed by exposure, etching, laser processing or the like.

The second modification of the third embodiment, therefore, provides the same effect as the first and third embodiments according to the wall 101 and the recessed portion 104.

Figure 49:
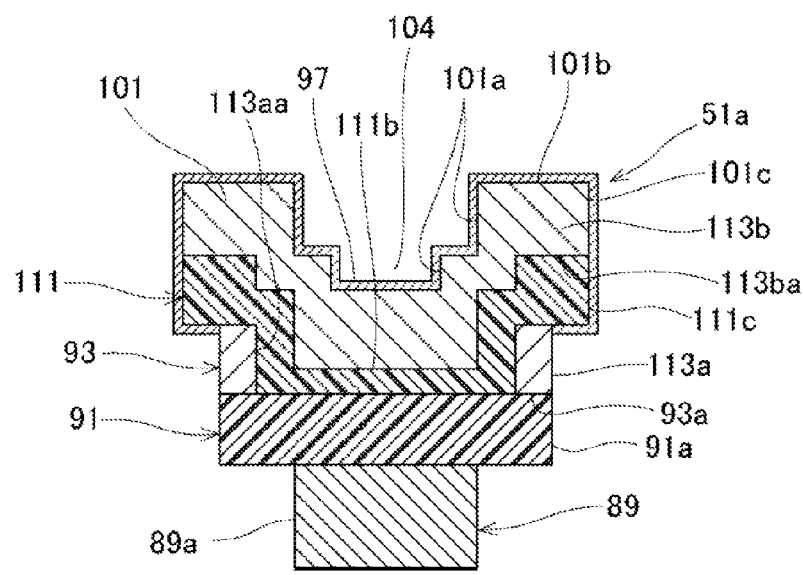
FIG. 49 is a sectional view on a plane corresponding to the plane taken along the line A-A of FIG. 8 according to a third modification of the third embodiment.
Figure 50:
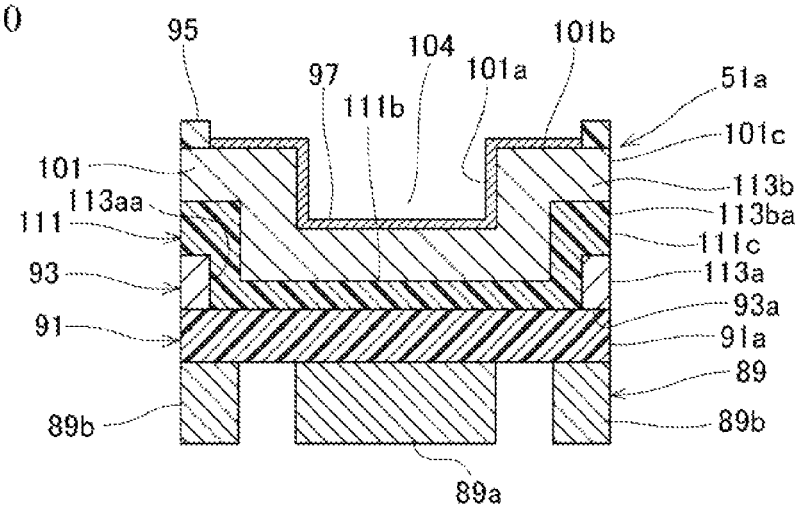
FIG. 50 is a sectional view on a plane corresponding to the plane taken along the line B-B of FIG. 8 according to the third modification of the third embodiment.

FIGS. 49 and 50 illustrate a third modification of the third embodiment. FIG. 49 is a sectional view on a plane corresponding to the plane taken along the line A-A of FIG. 8 and FIG. 50 is a sectional view on a plane corresponding to the plane taken along the line B-B of FIG. 8. In the third modification, the basic structure is referred to that of the first or second reference example or the first or third embodiment, and corresponding parts or components are represented with the same reference numerals as those of the first or second reference example or the first or third embodiment to eliminate duplicate explanation. Further, a difference between the third modification and the third embodiment will be mainly explained and explanation will be provided mainly for the internal terminal 51*a* of FIGS. 49 and 50.

The third modification of the third embodiment is an application to the flexure having the dual-layer wiring.

The third embodiment of FIGS. 43 and 44 has the thin portion 103 and the hole 111*a*, the thin portion 103 being the central portion of the terminal base insulating layer 91 thinned relative to the other portion thereof and the hole 111*a* formed in the intermediate insulating layer 111 to form the wall 101 and the recessed portion 104. In contrast, the third modification of FIGS. 49 and 50 forms a thin portion 111*b* that is the central portion of the intermediate insulating layer 111 thinned relative to the other portion thereof without a hole in the intermediate insulating layer 111 and a hole 113*aa* in the bottom copper layer 113*a* of the terminal layer 93 to form the wall 101 and a recessed portion 104. The others are the same as of the third embodiment of FIGS. 43 and 44.

The thin portion 111*b* of the intermediate insulating portion 111 is formed by exposure, etching, laser processing or the like. The hole 113*aa* of the bottom copper layer 113*a* is formed by etching, laser processing or the like.

The third modification of the third embodiment, therefore, provides the same effect as the first and third embodiments according to the wall 101 and the recessed portion 104.

Figure 51:
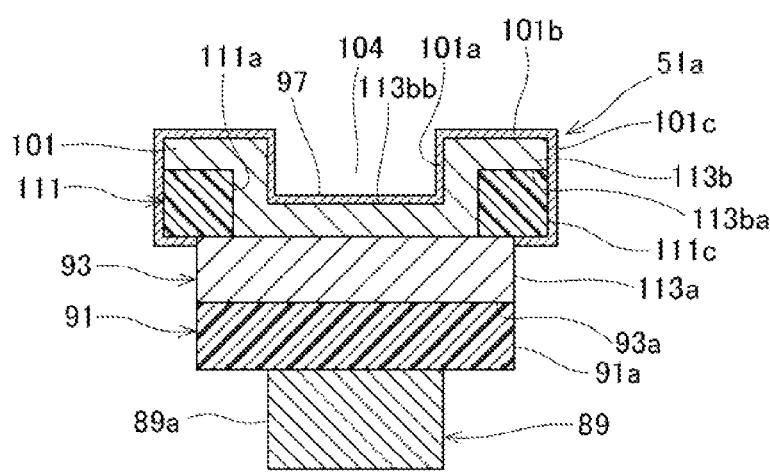
FIG. 51 is a sectional view on a plane corresponding to the plane taken along the line A-A of FIG. 8 according to a fourth modification of the third embodiment.
Figure 52:
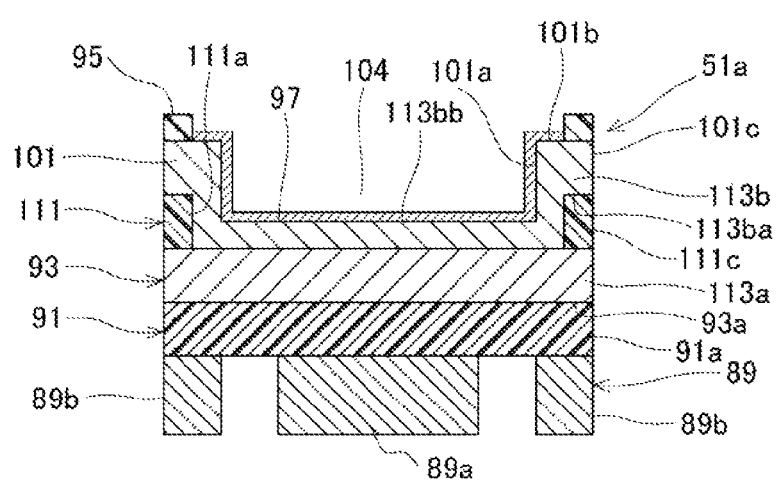
FIG. 52 is a sectional view on a plane corresponding to the plane taken along the line B-B of FIG. 8 according to the fourth modification of the third embodiment.

FIGS. 51 and 52 illustrate a fourth modification of the third embodiment. FIG. 51 is a sectional view on a plane corresponding to the plane taken along the line A-A of FIG. 8 and FIG. 52 is a sectional view on a plane corresponding to the plane taken along the line B-B of FIG. 8. In the fourth modification, the basic structure is referred to that of the first or second reference example or the first or third embodiment, and corresponding parts or components are represented with the same reference numerals as those of the first or second reference example or the first or third embodiment to eliminate duplicate explanation. Further, a difference between the fourth modification and the third embodiment will be mainly explained and explanation will be provided mainly for the internal terminal 51*a* of FIGS. 51 and 52.

The fourth modification is an application to the flexure having the dual-layer wiring.

The third embodiment of FIGS. 43 and 44 has the thin portion 103 and the hole 111a, the thin portion 103 being the central portion of the terminal base insulating layer 91 thinned relative to the other portion thereof and the hole 111a formed in the intermediate insulating layer 111, to form the wall 101 and the recessed portion 104. In contrast, the fourth modification of FIGS. 51 and 52 forms a thin portion 113bb that is the central portion of the top copper layer 113b thinned relative to the other portion thereof and the hole 111a in the intermediate insulating layer 111, to form a wall 101 and a recessed portion 104. The others of the fourth modification are the same as of the third embodiment of FIGS. 43 and 44.

The thin portion 113bb of the top copper layer 113bb is formed by partial etching for copper. The hole 111a of the intermediate insulating portion 111 is formed by etching, laser processing or the like.

The fourth modification of the third embodiment, therefore, provides the same effect as the first and third embodiments according to the wall 101 and the recessed portion 104.

Figure 53:
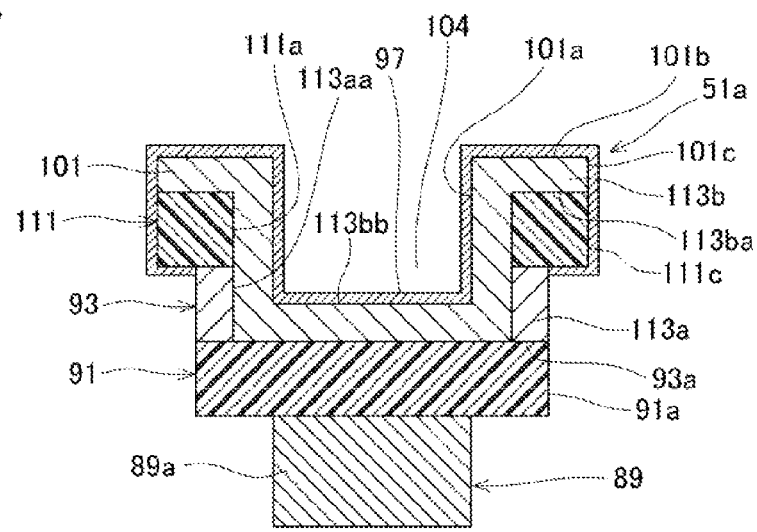
FIG. 53 is a sectional view on a plane corresponding to the plane taken along the line A-A of FIG. 8 according to a fifth modification of the third embodiment.
Figure 54:
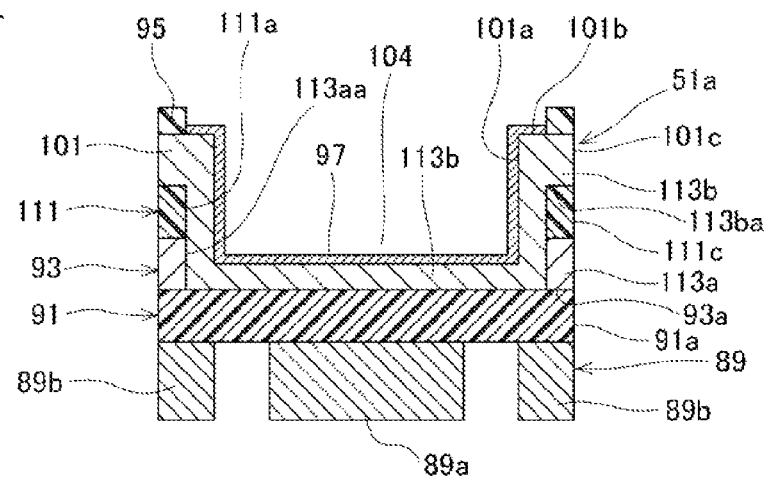
FIG. 54 is a sectional view on a plane corresponding to the plane taken along the line B-B of FIG. 8 according to the fifth modification of the third embodiment.

FIGS. 53 and 54 illustrate a fifth modification of the third embodiment. FIG. 53 is a sectional view on a plane corresponding to the plane taken along the line A-A of FIG. 8 and FIG. 54 is a sectional view on a plane corresponding to the plane taken along the line B-B of FIG. 8. In the fifth modification, the basic structure is referred to that of the first or second reference example or the first or third embodiment, and corresponding parts or components are represented with the same reference numerals as those of the first or second reference example or the first or third embodiment to eliminate duplicate explanation. Further, a difference between the fifth modification and the third embodiment will be mainly explained and explanation will be provided mainly for the internal terminal 51a of FIGS. 53 and 54.

The fifth modification of the third embodiment is an application to the flexure having the dual-layer wiring.

The third embodiment of FIGS. 43 and 44 has the thin portion 103 and the hole 111a, the thin portion 103 being the central portion of the terminal base insulating layer 91 thinned relative to the other portion thereof and the hole 111a formed in the intermediate insulating layer 111, to form the wall 101 and the recessed portion 104. In contrast, the fifth modification of FIGS. 53 and 54 forms the thin portion 113bb that is the central portion of the top copper layer 113b thinned relative to the other portion thereof and the holes 111a and 113aa in the intermediate insulating layer 111 and the bottom copper layer 113a, to form the wall 101 and the recessed portion 104 to trap solder material. The others are the same as of the third embodiment of FIGS. 43 and 44.

The thin portion 113bb of the top copper layer 113bb is formed by partial etching for copper. The holes 111a and 113a of the intermediate insulating portion 111 and the bottom copper layer is formed by etching, laser processing or the like.

The fifth modification of the third embodiment, therefore, provides the same effect as the first and third embodiments according to the wall 101 and the recessed portion 104.

Figure 55:
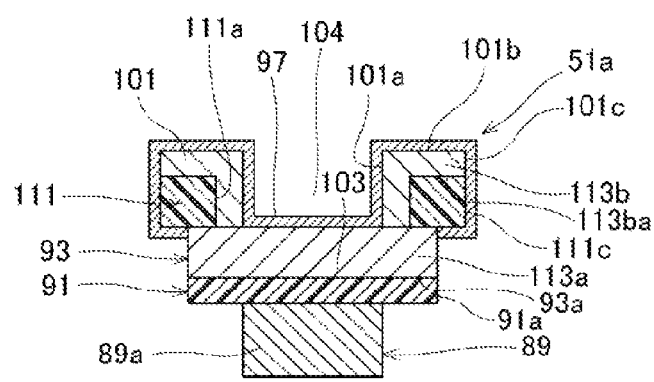
FIG. 55 is a sectional view on a plane corresponding to the plane taken along the line A-A of FIG. 8 according to a sixth modification of the third embodiment.
Figure 56:
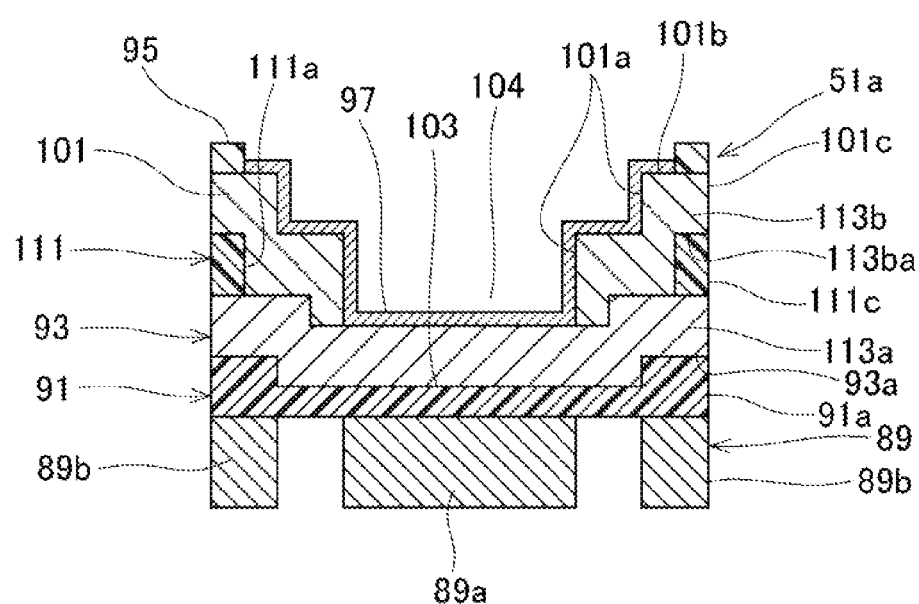
FIG. 56 is a sectional view on a plane corresponding to the plane taken along the line B-B of FIG. 8 according to the sixth modification of the third embodiment.

FIGS. 55 and 56 illustrate a sixth modification of the third embodiment. FIG. 55 is a sectional view on a plane corresponding to the plane taken along the line A-A of FIG. 8 and FIG. 56 is a sectional view on a plane corresponding to the plane taken along the line B-B of FIG. 8. In the sixth modification, the basic structure is referred to that of the first or second reference example or the first or third embodiment, and corresponding parts or components are represented with the same reference numerals as those of the first or second reference example or the first or third embodiment to eliminate duplicate explanation. A difference between the sixth modification and the third embodiment will be mainly explained and explanation will be provided mainly for the internal terminal 51a of FIGS. 55 and 56.

The sixth modification of the third embodiment is an application to the flexure having the dual-layer wiring.

The third embodiment of FIGS. 43 and 44 has the thin portion 103 and the hole 111a, the thin portion 103 being the central portion of the terminal base insulating layer 91 thinned relative to the other portion thereof and the hole 111a formed in the intermediate insulating layer 111 to form the wall 101 and the recessed portion 104. In contrast, the sixth modification of FIGS. 55 and 56 partly thins the terminal base insulating layer 91 to form the thin portion 103, forms the hole 111a in the intermediate insulating layer 111, and removes the central portion of the top copper layer 113b in the terminal layer 93, to form the wall 101 and the recessed portion 104.

As illustrated in the A-A cross-section of FIG. 55 and the B-B cross-section of FIG. 56, the gold plate 97 reaches the bottom copper layer 113a at the center of the terminal layer 93 in the recessed portion 104 according to the removing of the central portion of the top copper layer 113b. The others of the sixth modification are the same as of the third embodiment of FIGS. 43 and 44.

The removing of the central portion of the top copper layer 113b is realized by etching for copper, laser processing or the like.

The sixth modification of the third embodiment, therefore, provides the same effect as the first and third embodiments according to the wall 101 and the recessed portion 104.

Further, the removing of the central portion of the top copper layer 113b further deepens the recessed portion 104.

The method of forming the wall 101 of this modification is realized by adding to the method of the third embodiment a step etching or laser processing to shape the top copper layer 113b. It is easy to form the wall 101.

Other layer structures may be employed for the present invention other than of the third embodiment and its modifications.

The wall 101 and the recessed portion 104 are formed by a combination of the recessed shape at the central portion of the terminal layer 93 and the protruding shape around the central portion instead of the sole recessed shape or the sole protruding shape. For example, the structure of FIGS. 25 and 26 of the second embodiment is combined with the structure of FIGS. 11 and 12 of the first embodiment. Other recessed shape and protruding shape may be combined with each other to form the wall and the recessed portion.

Since the present invention is sufficient to suppress the flow of the reflowed or melted solder material with the wall 101, the partially etched portions may be omitted as long as the wall 101 fulfills the function.

The island portion 89a may be omitted or have another shape according to required rigidity or electric characteristics of the terminals.

What is claimed is:

1. A thin circuit board comprising:
   a metal support layer forming a substrate;
   a base insulating layer provided on a surface of the metal support layer;
   a wiring layer being wiring traces provided on a surface of the base insulating layer;
   a cover insulating layer covering the wiring traces;
   internal terminals provided to the respective wiring traces and sequentially arranged side by side, each one internal terminal of said internal terminals used to be solder-bonded to a corresponding external terminal through solder material;

a region, provided on a surface of said each one internal terminal, facing the corresponding external terminal when said each one internal terminal is solder-bonded to the corresponding external terminal through the solder material;

a terminal surface defined on the surface of said each one internal terminal in the region; and a wall, provided for the solder material on at least any one of adjacent internal terminals of said internal terminals, protruding from the surface of said at least any one of adjacent internal terminals in the region.

2. The thin circuit board according to claim 1, wherein the wall circumferentially surrounds a central portion of said any one of adjacent internal terminals to define a recessed portion for trapping the solder material.

3. The thin circuit board according to claim 1, wherein the wall is defined based on a hole and/or a thin part formed in at least one selected from the base insulating layer and the wiring layer.

4. The thin circuit board according to claim 1, wherein the wall is formed to a ground part extending from the wiring layer through the base insulating layer to the metal support layer for ground.

5. The thin circuit board according to claim 1, further comprising:

an opening formed through the cover insulating layer, wherein said each internal terminal is exposed to an outside through the opening of the cover insulating layer, and said wall, protruding from the surface of said at least any one of adjacent internal terminals, is exposed to the outside through the opening of the cover insulating layer in the region.

* * * * *